(12) United States Patent
Li et al.

(10) Patent No.: US 7,671,611 B2
(45) Date of Patent: Mar. 2, 2010

(54) APPARATUS, SYSTEM AND METHOD FOR TESTING ELECTRONIC ELEMENTS

(75) Inventors: Kuang-Jung Li, Taipei (TW); Chin-Chen Hsu, Taipei (TW); Yi-Li Lin, Taipei (TW); Shyan-I Wu, Taipei (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 0 days.

(21) Appl. No.: 12/069,814

(22) Filed: Feb. 13, 2008

(65) Prior Publication Data
US 2008/0136431 A1    Jun. 12, 2008

Related U.S. Application Data

(62) Division of application No. 11/090,900, filed on Mar. 25, 2005, now Pat. No. 7,374,293.

(51) Int. Cl.
*G01R 31/02* (2006.01)
*G01R 31/28* (2006.01)

(52) U.S. Cl. .............. 324/754; 324/765; 324/158.1; 702/118; 209/573

(58) Field of Classification Search .............. 324/754, 324/765; 702/118; 209/573
See application file for complete search history.

(56) References Cited

U.S. PATENT DOCUMENTS

| | | | |
|---|---|---|---|
| 3,896,935 A * | 7/1975 | Hjelle et al. ............. | 209/573 |
| 5,124,646 A | 6/1992 | Shiraishi ............. | 324/158 |
| 5,220,278 A | 6/1993 | Sekii ............. | 324/158 |
| 5,235,271 A | 8/1993 | Kira ............. | 324/158 |
| 5,467,020 A | 11/1995 | Boyette, Jr. et al. ....... | 324/537 |
| 5,726,920 A * | 3/1998 | Chen et al. ............. | 702/108 |
| 5,764,069 A * | 6/1998 | Cugini ............. | 324/761 |
| 5,834,838 A | 11/1998 | Anderson ............. | 257/697 |
| 5,986,458 A | 11/1999 | Saito et al. ............. | 324/754 |
| 6,194,908 B1 | 2/2001 | Wheel et al. ............. | 324/761 |
| 6,462,556 B2 | 10/2002 | Yamashita et al. ......... | 324/537 |
| 6,592,325 B2 | 7/2003 | Lu et al. ............. | 414/752.1 |
| 6,781,363 B2 * | 8/2004 | Chen ............. | 324/158.1 |
| 6,794,887 B1 | 9/2004 | Nelson et al. ............. | 324/754 |
| 2007/0075719 A1 * | 4/2007 | Chung et al. ............. | 324/765 |

\* cited by examiner

*Primary Examiner*—Ha Tran T Nguyen
*Assistant Examiner*—Emily Y Chan
(74) *Attorney, Agent, or Firm*—Mayer & Williams PC

(57) ABSTRACT

An electronic element testing apparatus for use with a number of probes. Each probe has a lower pole and an upper pole. The apparatus includes: a first plate having a first side and a second side, the first side having an array of lower pole regions disposed thereabout, each lower pole region configured to receive a lower pole of a probe; and a plurality of signal conductor regions disposed proximate the array of lower pole regions, each signal conductor region arranged to provide a non-cable electrical path between a lower pole region and a switching circuit. The switching circuits are operable to sequentially connect each electronic element to a testing circuit via the upper and lower poles.

5 Claims, 22 Drawing Sheets

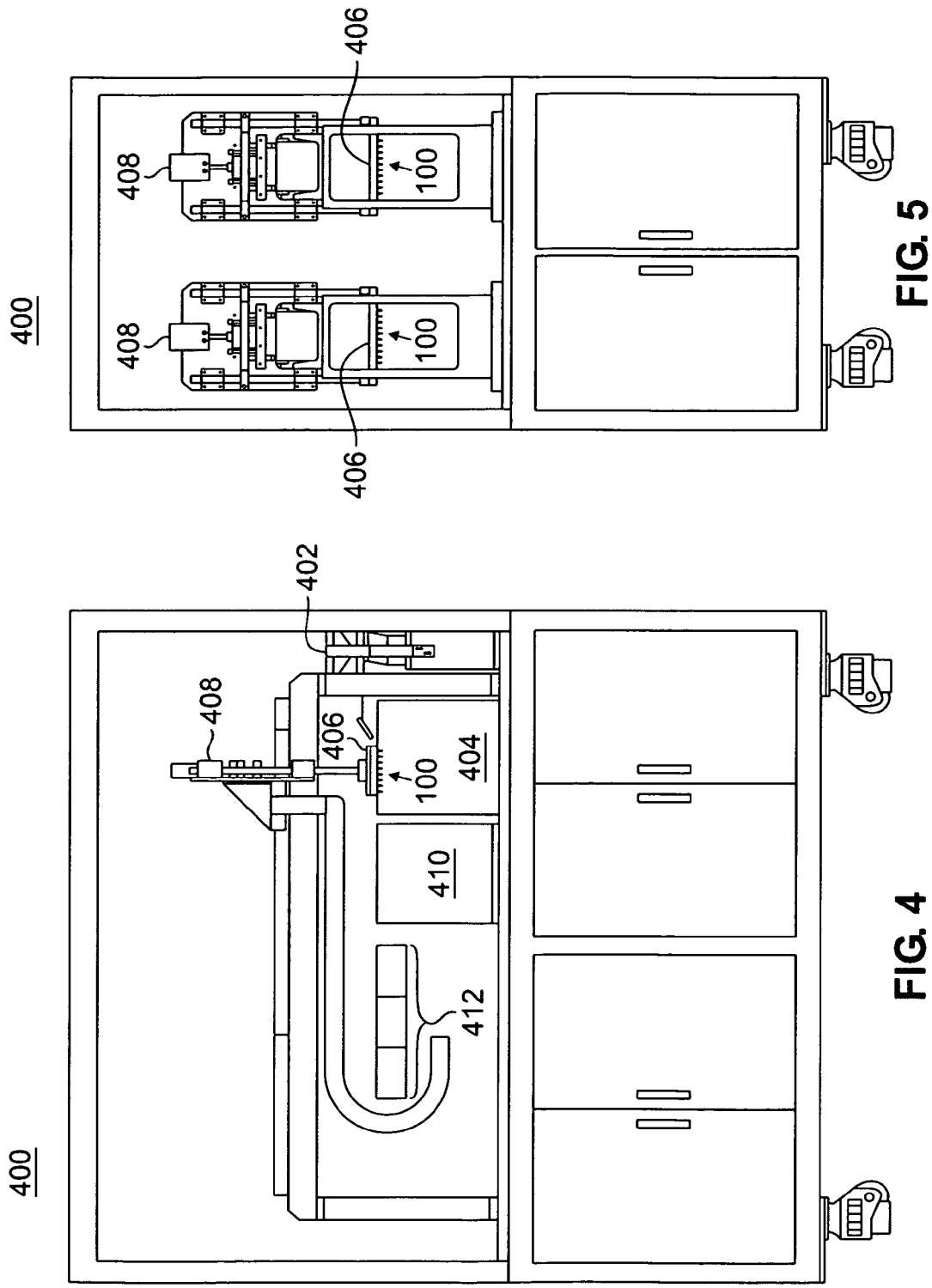

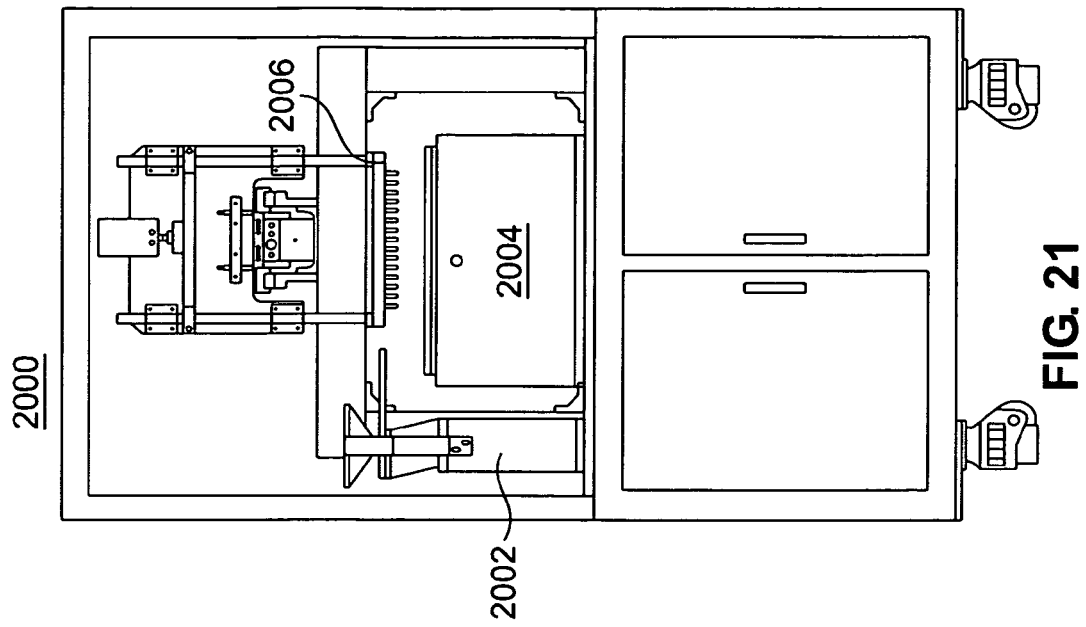
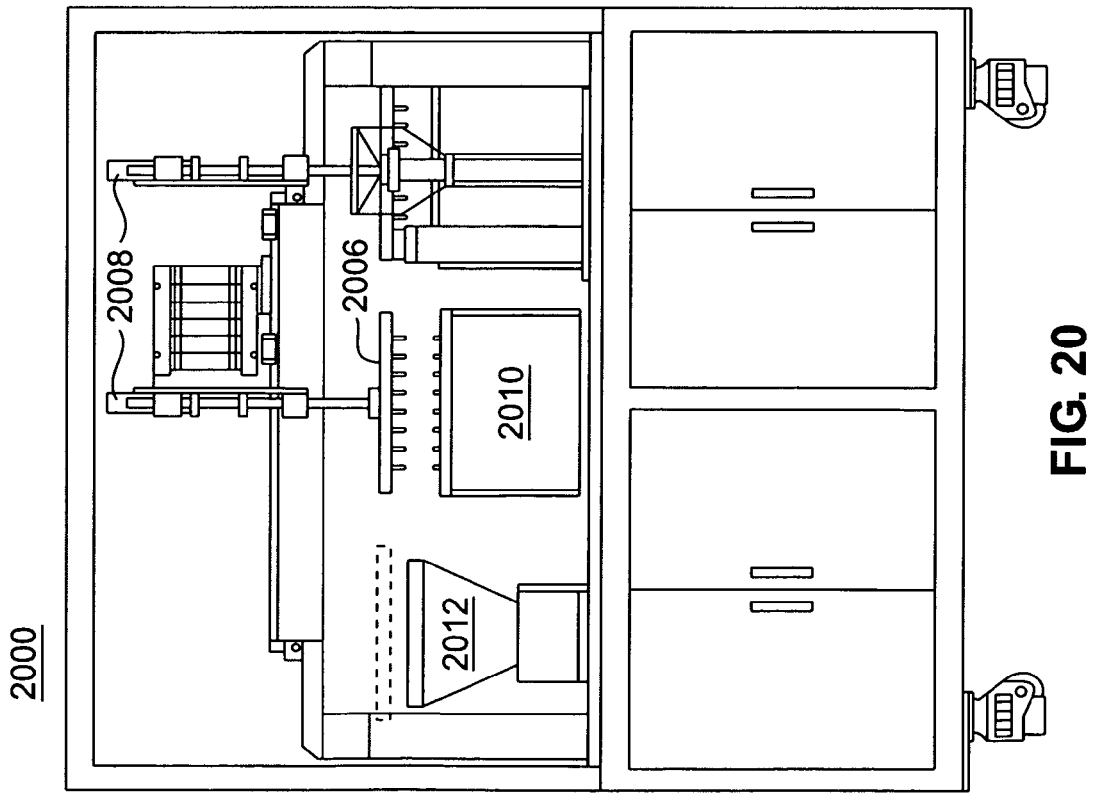

APPARATUS, SYSTEM AND METHOD FOR TESTING ELECTRONIC ELEMENTS

STATEMENT OF RELATED APPLICATION

This application is a divisional of U.S. patent application Ser. No. 11/090,900, filed Mar. 25, 2005, entitled "Apparatus, System and Method for Testing Electronic Elements", which is incorporated by reference in its entirety herein.

BACKGROUND

Aspects of this invention relate generally to testing of electronic elements, and more particularly to an apparatus and system for testing a number of electronic elements such as semiconductor devices using a number of probes, and to a method for sorting a number of electronic elements into a number of receptacles.

Electronic elements such as semiconductor devices typically undergo testing prior to various stages of packaging. FIG. 1 is a simplified diagram of a typical electronic element 100, such as a diode, which includes an active element 102 in chip form (typically silicon) doped with small amounts of boron, arsenic, phosphorus, zinc, germanium, or other elements. Active element 102 is in contact with terminal regions 104. Two terminal regions 104 are shown, although additional terminal regions are possible. Terminal regions 104 may take the form of thin layers of metals such as aluminum, gold or titanium prior to being bonded to a lead frame (not shown). After bonding to a lead frame, terminal regions 104 may take the form of gold or aluminum wires.

Prior to various stages of packaging electronic element 100, such as prior to attaching a lead frame thereto, and/or prior to enclosing electronic element 100 in a case of glass, plastic or metal, it is desirable to use terminal regions 104 to measure certain electrical characteristics of electronic element 100 using probes and a testing circuit—similar devices with satisfactory electrical characteristics may then be separated from devices with unsatisfactory electrical characteristics.

Probes are conductive elements that contact terminal regions 104 of an electronic element 100, and provide at least a portion of an electrical path to a testing circuit. As shown in FIG. 1, a probe 105 has an upper pole 106 in contact with one terminal region 104 of electronic element 100, and has a lower pole 108 in contact with another terminal region 104, although more than two terminal regions of electronic element 100 may be in contact with probes.

Examples of measured electrical characteristics of a diode include, but are not limited to, reverse current of the diode, forward voltage of the diode, and reverse breakdown voltage of the diode. A schematic diagram of a testing circuit 200 suitable for testing diode reverse current (IR) is shown in FIG. 2, and a schematic diagram of a testing circuit 300 suitable for testing diode forward voltage (VF) is shown in FIG. 3.

In one conventional testing technique, semiconductor devices are tested and sorted individually—one-by-one, devices are mechanically transferred to and from a testing station, where they are electrically connected to probes and testing circuits.

Another known testing technique involves testing several (usually less than ten) devices in a single cycle at a testing station. In the latter technique, probes are connected to switches using wire cable, and the switches are responsive to testing circuits. Switches and testing circuits are often integrated onto switching boards.

One factor that reduces the efficiency of manufacturing and/or assembly operations of semiconductor devices is the amount of time the devices spend being transferred to and from testing stations. One way to reduce device transfer time during testing is to increase the number of devices tested per cycle. The complexity of corresponding testing hardware and control generally increases, however, in proportion to the number of devices tested per cycle. In particular, (1) the volume and complexity of wire cables connecting probes with switching boards increases, making the testing hardware more difficult to maintain or re-configure, and (2) performing post-testing sorting operations, including the management of testing results, becomes more difficult. Maintenance, reconfiguration, and result management difficulties are further exacerbated when devices of different shapes, sizes and electrical characteristics are tested in the same cycle.

There are therefore needs for apparatuses, systems, and methods for testing electronic elements, which increase efficiency of testing processes, while enhancing serviceability and configurability of testing hardware.

SUMMARY

According to an aspect of the present invention, the foregoing needs are addressed by an electronic element testing apparatus for use with a number of probes (e.g., 100). Each probe has a lower pole and an upper pole. The apparatus includes: a first plate having a first side and a second side, the first side, which may be a printed circuit board such as a motherboard, having an array of lower pole regions disposed thereabout, each lower pole region configured to receive a lower pole of a probe; and a plurality of signal conductor regions disposed proximate the array of lower pole regions, each signal conductor region arranged to provide a non-cable electrical path between a lower pole region and a switching circuit. When lower poles are disposed at at least some of the lower pole regions, when each lower pole contacts a first terminal region of an electronic element, when an upper pole complementary to each lower pole contacts a second terminal region of the electronic element, and when each signal conductor region provides a non-cable electrical path between a lower pole region and a switching circuit, the switching circuits are operable to sequentially connect each electronic element to a testing circuit via the upper and lower poles.

Each upper pole is adapted to pick-up an electronic element such as a diode and place the electronic element proximate a lower pole. The upper poles may be secured to an upper probe plate, substantially parallel to the first plate, one of the first plate and the upper probe plate movable with respect to the other to bring the upper poles and the lower poles in electrical contact with an electronic element disposed therebetween.

The switching circuits, which may be reed relays, are disposed on a second plate, which is configured for electrical communication with the first plate via the plurality of signal conductor regions. The second plate and the first plate are connectable to form a portable switching apparatus. A testing circuit, switchably connectable, via the switching circuits, to the plurality of lower pole regions, may be arranged to determine an electrical characteristic of an electronic element.

According to another aspect of the present invention, a system for testing a number of electronic elements using a number of probes, each probe having a lower pole and an upper pole, includes a testing apparatus. The testing apparatus includes a first plate having a first side and a second side, the first side having an array of lower pole regions disposed thereabout, each lower pole region configured to receive a lower pole of a probe, and a plurality of signal conductor regions disposed proximate the array of lower pole regions, each signal conductor region arranged to provide a non-cable electrical path between a lower pole region and a switching circuit. The system further includes a computer-readable storage medium and a processor responsive to the testing apparatus, to the computer-readable storage medium, and to a computer program. When the computer program is loaded into the processor, it is operative to control the testing apparatus to produce test results by causing the switching circuits to sequentially connect each electronic element to a testing circuit via the upper and lower poles of a probe, when lower poles are disposed at at least some of the lower pole regions, when each lower pole contacts a first terminal region of an electronic element, when an upper pole, responsive to a complementary lower pole, contacts a second terminal region of the electronic element, and when each signal conductor region provides a non-cable electrical path between a lower pole region and a switching circuit, and to control storage of the test results in the computer-readable storage medium.

The computer-readable storage medium may be a memory map having a number of memory zones, each memory zone corresponding to a predetermined range of test results, each memory zone having a number of test result areas corresponding to the number of electronic elements. Based on the test results, the computer program is operative to control storage of a particular test result in a particular memory zone and test result area of the memory map.

A number of sorting receptacles corresponding to the number of memory zones may be arranged to receive electronic elements from the testing apparatus. The computer program is further operative to cause substantially simultaneous placement of the electronic elements into a particular sorting receptacle associated with a particular memory zone based on contents of the test result areas of the particular memory zone.

According to a further aspect of the present invention, a method for sorting a number of electronic elements into a plurality of sorting receptacles using a testing apparatus and a number of probes, each probe having a lower pole and an upper pole, is provided. The testing apparatus includes a first plate having a first side and a second side, the first side having an array of lower pole regions disposed thereabout, each lower pole region configured to receive a lower pole of a probe, and a plurality of signal conductor regions disposed proximate the array of lower pole regions, each signal conductor region arranged to provide a non-cable electrical path between a lower pole region and a switching circuit. The method includes: when lower poles are disposed at at least some of the lower pole regions, arranging for establishment of electrical contact between each lower pole and a first terminal region of an electronic element; arranging for establishment of electrical contact between each of a plurality of upper poles and a second terminal region of the electronic element, each upper pole complementary to a lower pole; arranging for establishment of a non-cable electrical path between each lower pole and a switching circuit; testing the electronic elements by causing the switching circuits to sequentially connect each electronic element to a testing circuit via the upper and lower poles, the testing circuit producing a set of test results; arranging for storage of the set of test results in a memory; and based on the set of test results, arranging for substantially simultaneous placement of each electronic element belonging in a first sorting receptacle into the first sorting receptacle; and after the step of placing each electronic element belonging in the first sorting receptacle into the first sorting receptacle, based on the set of test results, arranging for substantially simultaneous placement of each electronic element belonging in a second sorting receptacle into the second sorting receptacle.

The step of arranging for storage of the set of test results in a memory may further include: locating a number of memory zones (corresponding to the number of sorting receptacles) in the memory, each memory zone corresponding to a predetermined range of test results and having a number of test result areas corresponding to the number of electronic elements, the memory zones and the test result areas collectively comprising a memory map; and arranging for storage of a particular test result of the set of test results in the memory map.

The step of arranging for storage of a particular test result of the set of test results in the memory map may include: after testing a particular electronic element, arranging for storage of the test result in a particular test result area of each memory zone, and the step of arranging for storage of the test result in a particular test result area of each memory zone may include either setting or clearing a flag in the particular test result area of each memory zone—when a flag is set in a particular test result area of one memory zone, a flag is cleared in a corresponding test result area of another memory zone.

The step of arranging for substantially simultaneous placement of each electronic element belonging in a first sorting receptacle into the first sorting receptacle may further include: identifying a particular memory zone corresponding to the first sorting receptacle; for each test result area of the identified memory zone, determining whether the flag in each test result area indicates an electronic element associated with the test result area belongs in the first sorting receptacle; and arranging for substantially simultaneous placement of each electronic element in the first sorting receptacle when the flags in the test result areas associated with the electronic elements indicate that the electronic elements belong in the first sorting receptacle.

According to a still further aspect of the present invention, a computer-readable medium is encoded with a computer program which, when loaded into a processor, implements the foregoing method.

BRIEF DESCRIPTION OF THE DRAWINGS

FIG. 4 is a diagram of a front view of a first system for handling the electronic element shown in FIG. 1, using various aspects of the present invention.

FIG. 5 is a diagram of a side view of the system shown in FIG. 4.

FIG. 20 is a diagram of a front view of a second system for handling the electronic element shown in FIG. 1, using various aspects of the present invention.

FIG. 21 is a diagram of a side view of the system shown in FIG. 20.

DETAILED DESCRIPTION

Figure 1:
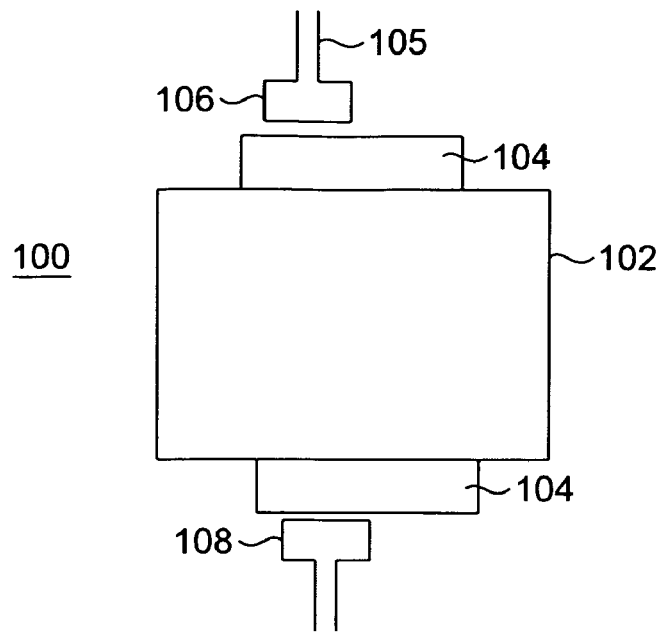
FIG. 1 is a simplified diagram of an electronic element that may undergo handling using various aspects of the present invention.

Turning now to the drawings, where like numerals designate like components, FIG. 4 is a diagram of a front view of a system 400 that uses various aspects of the present invention to handle a large number (at least about fifty) electronic elements 100 (shown in FIG. 1), preferably diodes in chip form, in connection with measuring electrical characteristics of the elements and sorting the elements based on the measured electrical characteristics. System 400 includes a feeder 402, a shake loading station 404, a transfer plate 406, a transfer arm 408, a testing station 410, and a sorting station 412 having a number of receptacles. As shown in side view in FIG. 5, system 400 includes at least some redundant parts.

Feeder 402 is constructed in a well-known manner of a combination of commercial and machined parts (not shown in detail), such as a hopper, a linear feeder, and a stand.

Figure 6:
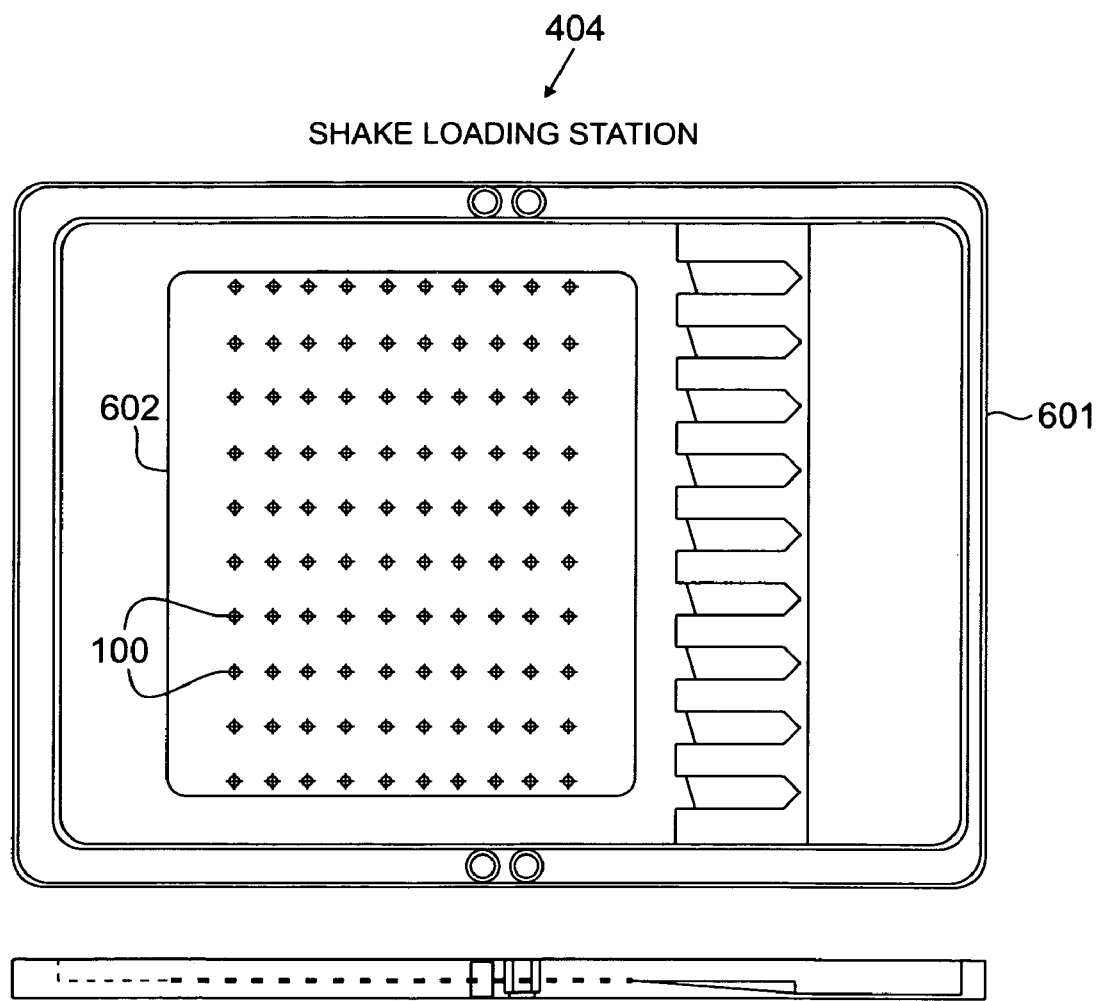
FIG. 6 is a top view of the shake loading station shown in FIG. 4.

Shake loading station 404 may include a shake loader 601 (discussed further below, in connection with FIG. 6) made of machined parts, and a shake unit (not shown) having machined parts, a cylinder, and a motor. Shake loading station 404 is constructed and operated in manners well known to those in the art. As shown in FIG. 6 in top view, shake loader 601 operates to align electronic elements 100 in an array 602, which may be any desired size, but which is preferably arranged to receive at least one hundred electronic elements 100.

Figure 7:
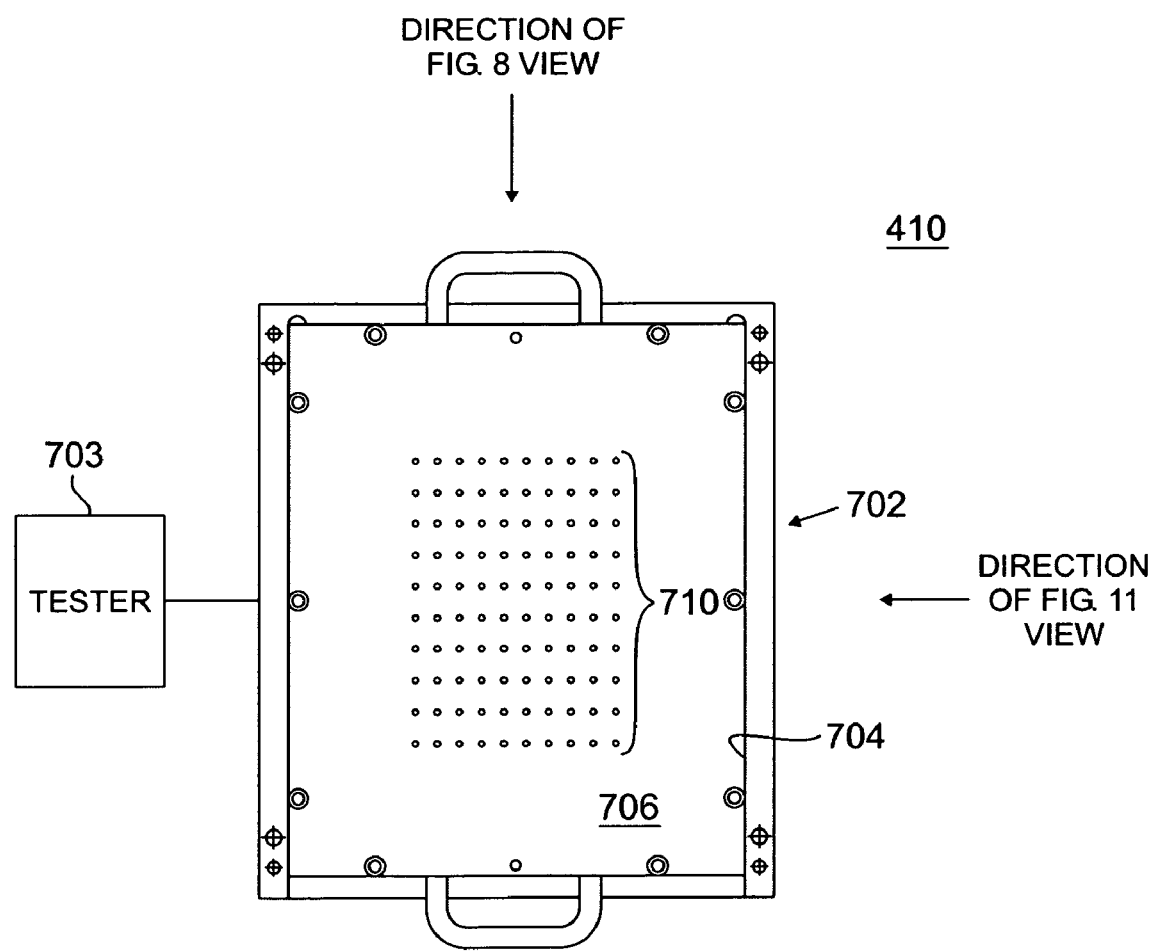
FIG. 7 is a diagram of a top view of a switching box located at the testing station shown in FIG. 4.

Referring again to FIG. 4, testing station 410, shown in greater detail in FIG. 7, includes, among other things, a switching box 702 and a tester 703. Switching box 702 (shown in top view) is responsive to tester 703, which preferably includes one or more testing circuits 200 (shown in FIG. 2) and/or testing circuits 300 (shown in FIG. 3), suitable for testing diode reverse current (IR), and diode forward voltage (VF), respectively.

Figure 8:
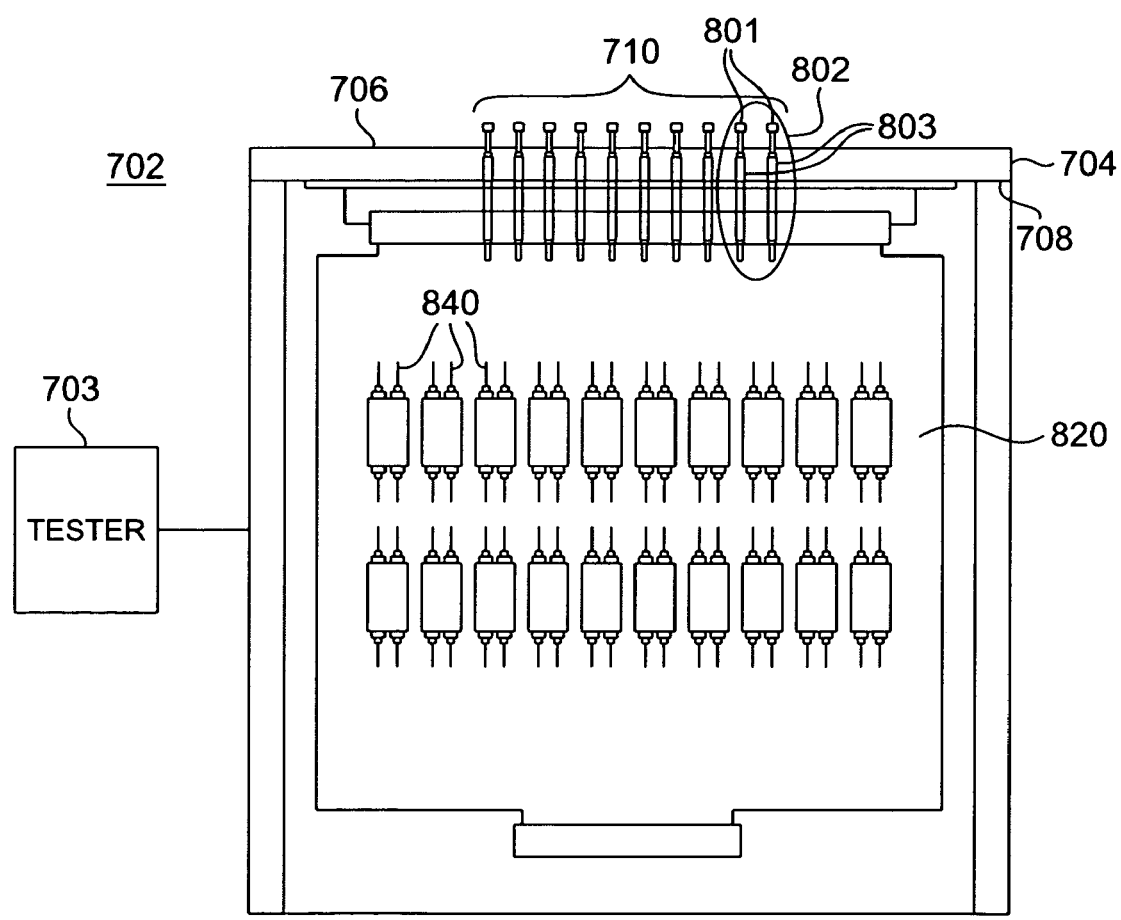
FIG. 8 is a first internal side view of the switching box shown in FIG. 7.
Figure 9:
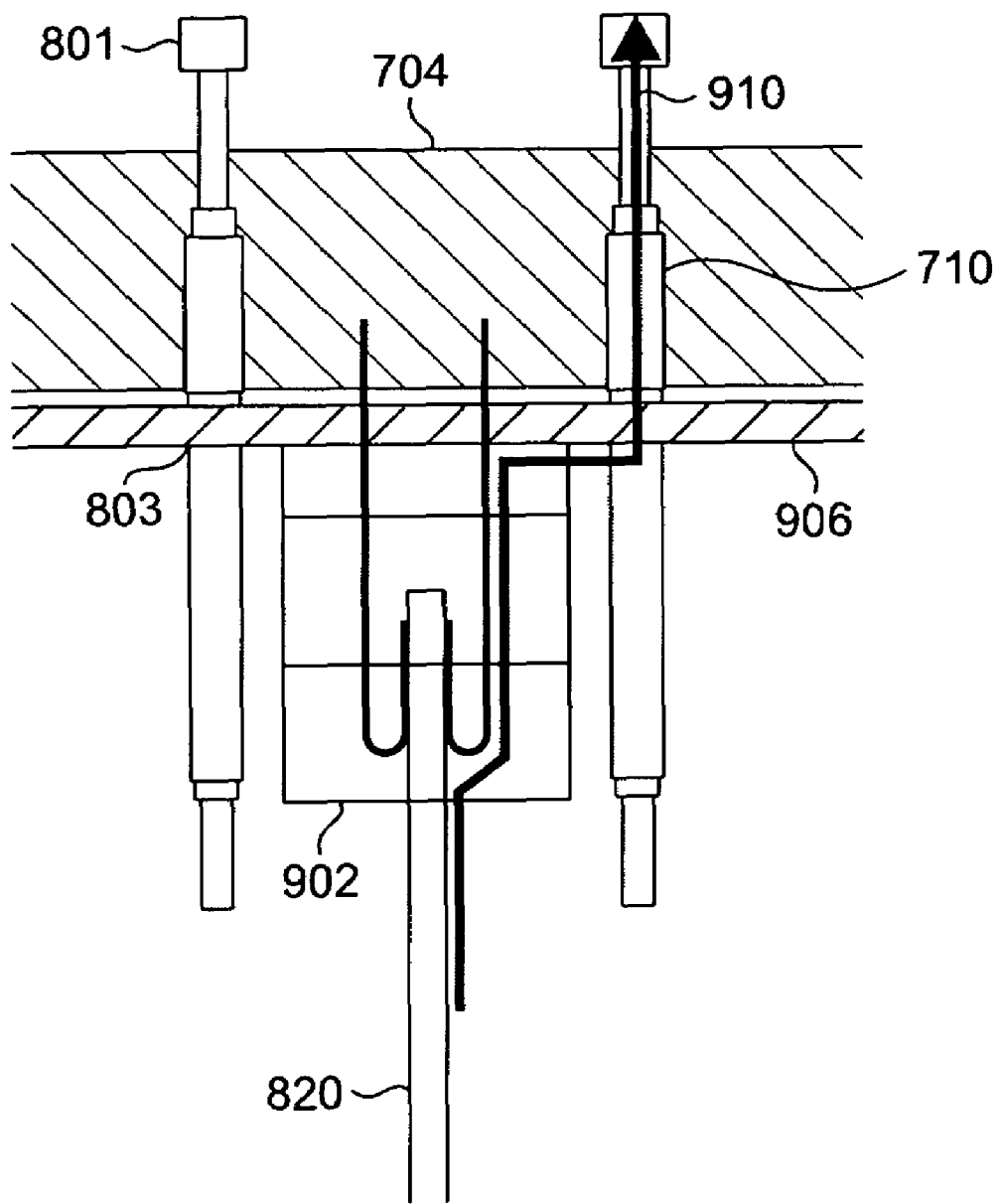
FIG. 9 is an expanded view of a portion of the switching box shown in FIG. 8.
Figure 10:
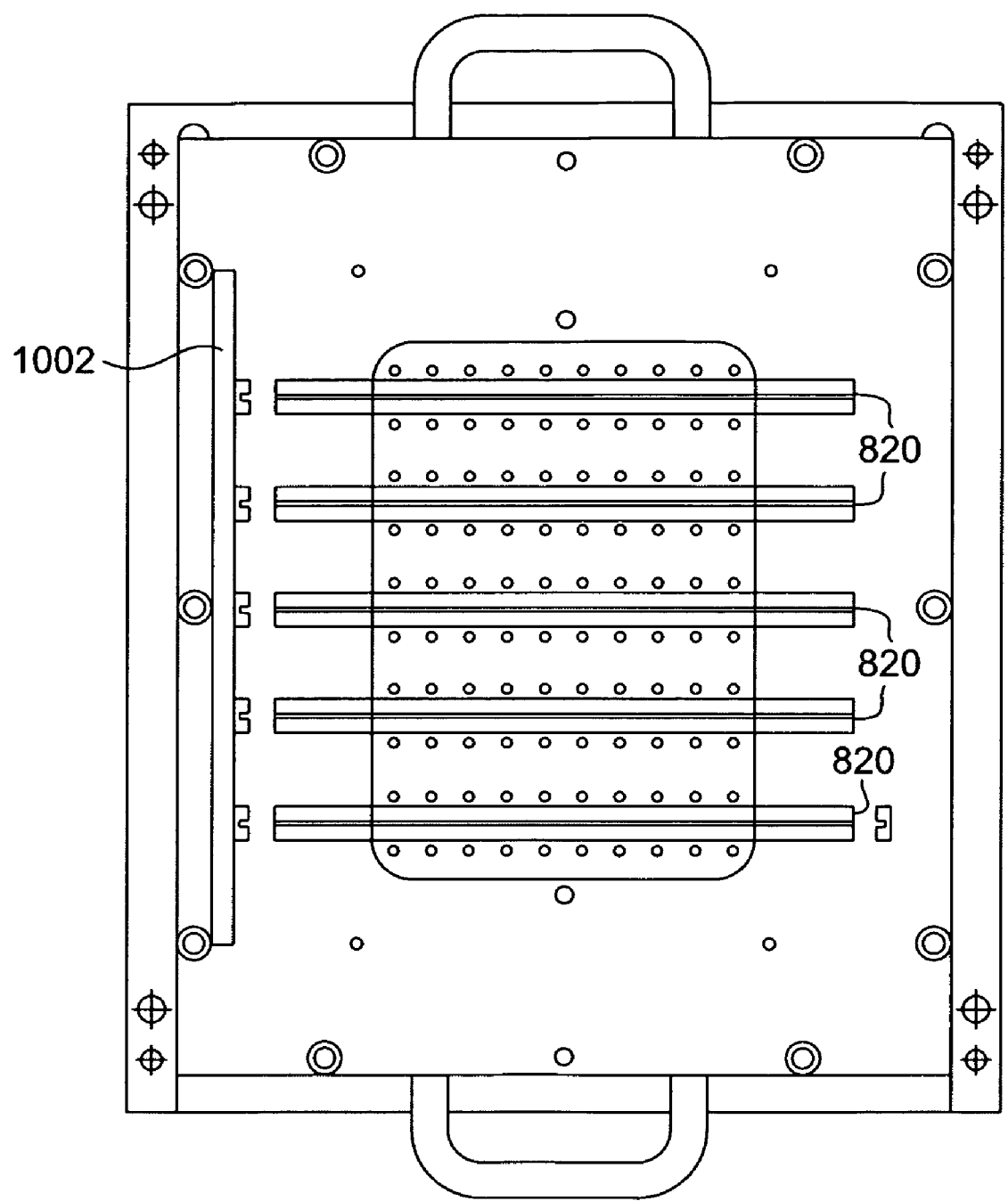
FIG. 10 is a pass-through top view of the switching box shown in FIG. 7.
Figure 11:
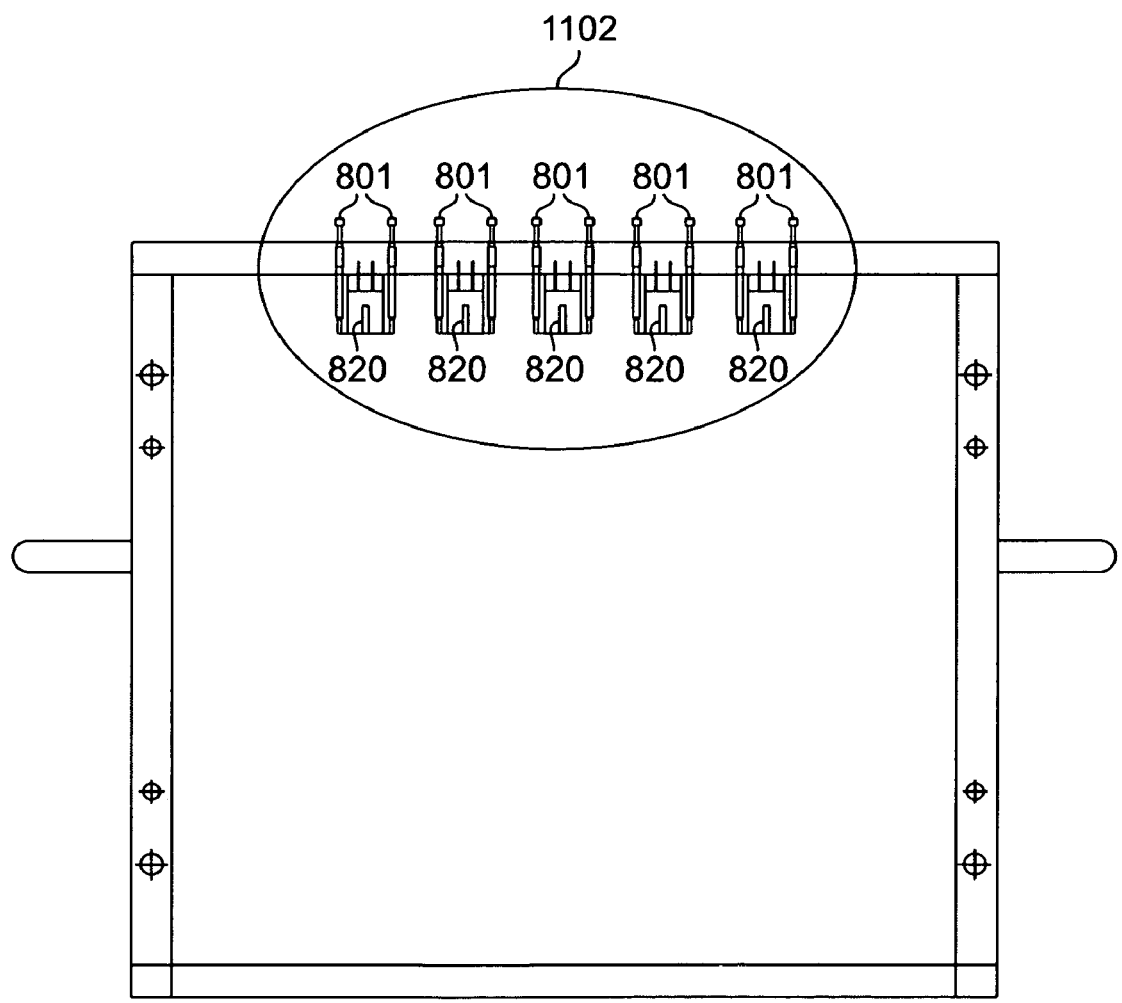
FIG. 11 is a second internal side view of the switching box shown in FIG. 7.
Figure 12:
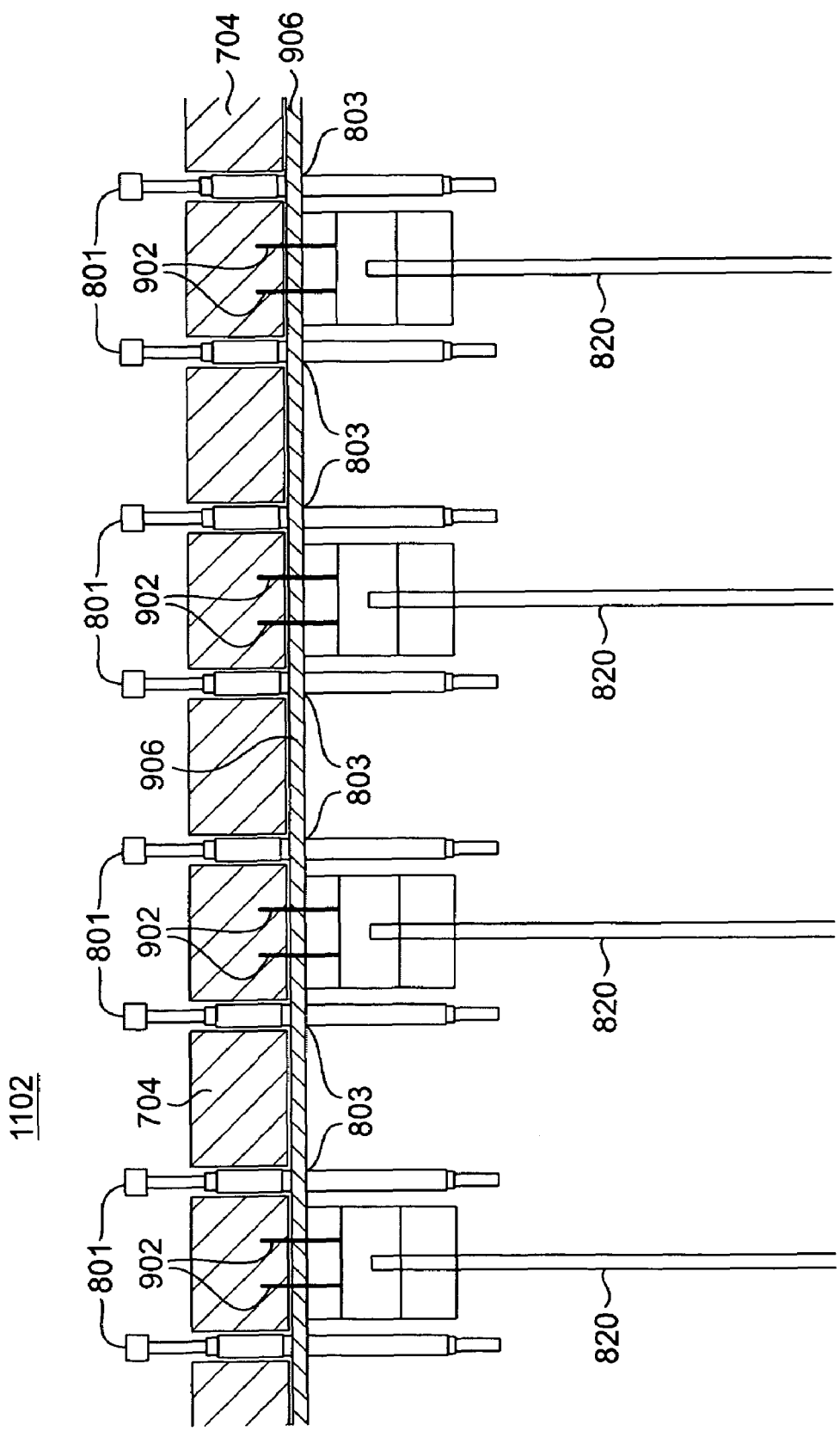
FIG. 12 is an expanded view of a portion of FIG. 11.

FIG. 8 is a first internal side view of switching box 702; FIG. 9 is an expanded view of area 802, depicted in FIG. 8; FIG. 10 is a pass-through top view of switching box 702; FIG. 11 is a second internal side view of switching box 702; and FIG. 12 is an expanded view of area 1102, depicted in FIG. 11.

Switching box 702 includes, among other things, a plate 704 having two sides—a top side 706 (first shown in FIG. 7) and a bottom side 708 (first shown in FIG. 8)—and one or more switching boards 820 (one visible in FIG. 8). A motherboard 906 (shown in FIG. 9 and discussed further below) is mounted on bottom side 708.

Switching board 820 is preferably a printed circuit board upon which a number of switching circuits 840, such as reed relays, are arranged. As shown in FIG. 10, it may be desirable to locate multiple switching boards 820 within switching box 702. For example, boards 820 may be secured to a backplane 1002, and positioned under, and perpendicular to, plate 704 (although it will be understood that other orientations of plate 704 and switching board 820 relative to each other are possible).

Referring again to FIGS. 7, 8, and 9, plate 704 may be any suitable surface. Attaching a motherboard 906 (shown in FIG. 9) to bottom side 708 is preferable. An array of lower pole regions 710, which may be holes or notches in plate 704 and/or motherboard 906, or which may be probe receptacles soldered to motherboard 906 into which contact probes are plugged, is located about top side 706. As shown, top side 706 includes 100 lower pole regions 710. As can be further seen in FIG. 9, each lower pole region 710 is configured to receive a lower pole 801 of a probe, or a portion thereof (for example, probe receptacles, which allow for easy reconfiguration of probes, may be soldered onto motherboard 906, and contact probes plugged into the probe receptacles). Signal conductor regions 803, preferably made of a conductive metal such as copper, are disposed proximate the array of lower pole regions 710. Each signal conductor region 803 provides at least part of a non-cable electrical path between a lower pole region 710 and one or more switching circuits 840 on switching board 820. Signal conductor regions 803 may include, among other elements, metal-coated through-holes through motherboard 906. Edge connectors 902 (more specifically, pins thereof) of switching board 820 may also be disposed through, and soldered on the bottom side of, motherboard 906 and/or plate 704.

In conjunction with FIG. 9, FIG. 11 (a second internal view of switching box 702) and FIG. 12 (an expanded view of region 1102 shown in FIG. 11) illustrate how lower poles 801 and switching board(s) 820 may be arranged for electrical communication. Signal conductor regions 803 (shown in FIG. 12) may be (at least in part), or may be in contact with, pins of edge connectors 902 (shown in FIGS. 9 and 12), to enable lower poles 801 or portions thereof (when they are disposed in selected lower pole regions 710) to be in electrical communication with switching circuits 840 on switching board(s) 820 without the use of a large volume of cable-type wires that typically characterizes connections between probes and switching boards. As shown by arrow 910 in FIG. 9, when probes and edge connectors are soldered onto motherboard 906, testing signals will go through switching boards 820, edge connectors/pins 902, signal conductor regions 803 (such as metal-coated through-holes), and lower poles 801 to electronic elements 100. Thus, switching box 702 provides a portable platform for testing a large number of electronic elements, which may be more readily reconfigured and more easily serviced than traditional testing station hardware.

Figure 13:
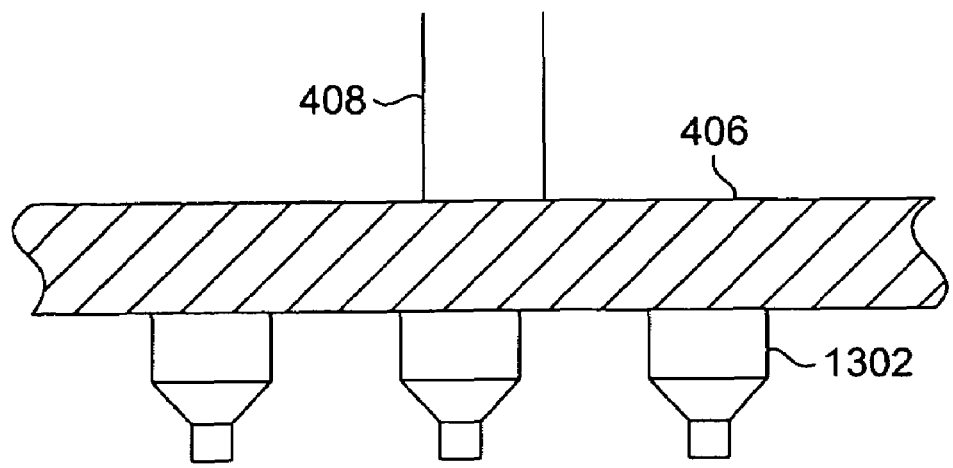
FIG. 13 is a partial side view of the transfer plate shown in FIG. 4.

FIG. 13 is a partial side view of transfer plate 406 (shown in FIG. 4), which is preferably metal but may be another suitable material. Suction tips 1302, which are preferably copper, are arranged on transfer plate 406 in an array pattern complementary to array 710 (shown in FIG. 7).

Figure 14:
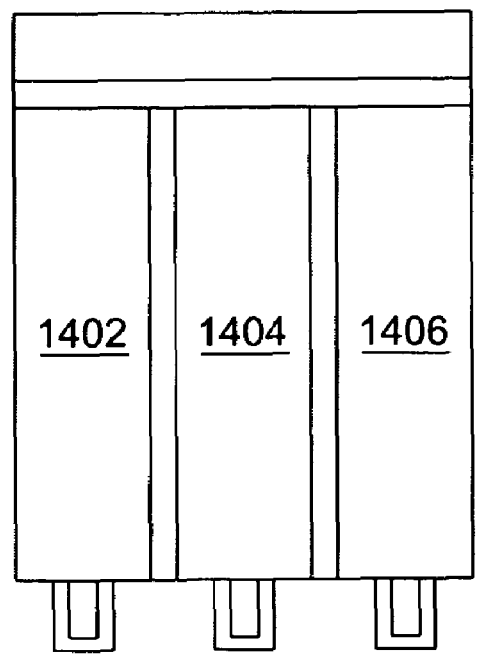
FIG. 14 is a top view of the sorting station shown in FIG. 4.

FIG. 14 is a top view of sorting station 412 (shown in FIG. 4). As shown, sorting station 412 includes three receptacles 1402, 1404, and 1406, which are preferably bins. More or fewer receptacles are possible, however, and receptacles and/or packaging other than bins may be used.

Figure 2:
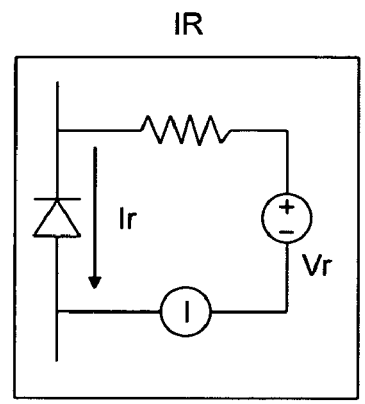
FIG. 2 is a schematic diagram of a circuit for testing reverse current of the electronic element shown in FIG. 1.
Figure 3:
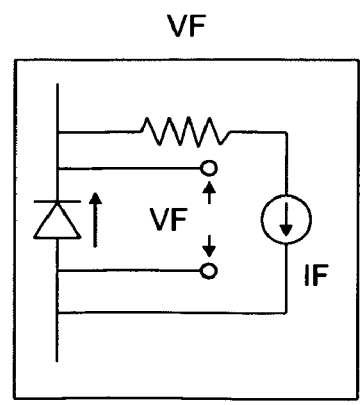
FIG. 3 is a schematic diagram of a circuit for testing forward voltage of the electronic element shown in FIG. 1.

Referring again to FIG. 4, during normal operation of system 400, two testing stations 410 are used, each having a switching box 702 (shown in FIG. 7) with one hundred lower poles 801 (shown in FIG. 8) and one or more testers 703 (also shown in FIG. 7) suitable for testing diode reverse current (IR), such as testers including testing circuits 200 (shown in FIG. 2).

Electronic elements 100 arrive at feeder 402, which operates in a well-known manner to introduce electronic elements 100 to shake loading station 404. Transfer arm 408 positions transfer plate 406 above an area substantially parallel to transfer plate 406, such as above shake loading station 404, testing station 410, or sorting station 412. Suction tips 1302 (shown in FIG. 13) on transfer plate 406 may be moved vertically by one or more air cylinders (not shown), and horizontally by one or more actuators (not shown) in well-known manners to pick up electronic elements 100 from one position and to place electronic elements 100 in another position.

Figure 15:
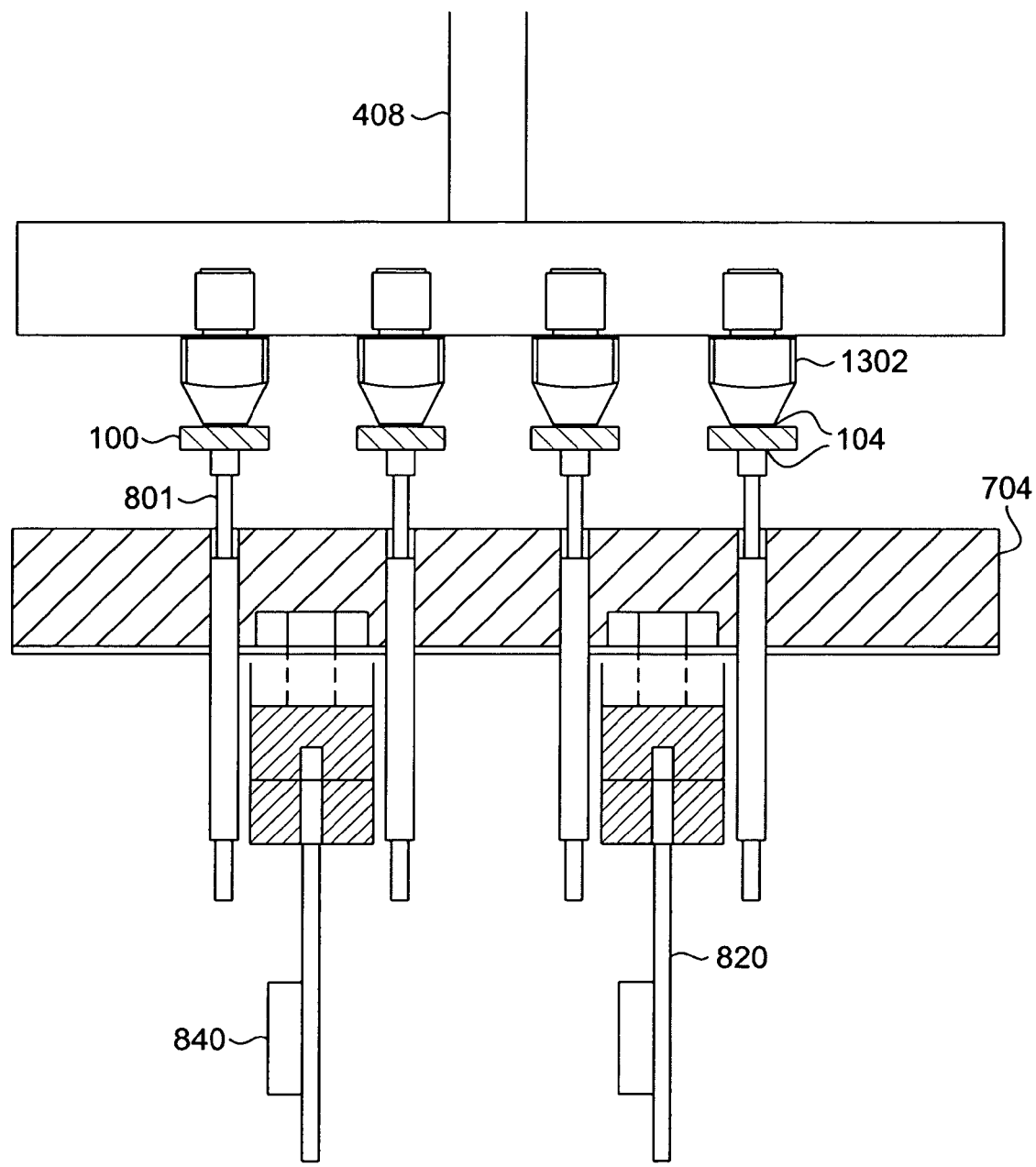
FIG. 15 shows the transfer plate of FIG. 13 in partial side view during normal operation at the testing station shown in FIG. 4.

For example, as shown in FIG. 15, when electronic elements 100 are picked up from shake loading station 404 and placed at testing station 410, transfer arm 408 positions transfer plate 406 such that suction tips 1302 are in contact with terminal regions 104 of electronic elements 100, and complementary lower poles 801 are in contact with corresponding terminal regions 104 of electronic elements 100.

Figure 16:
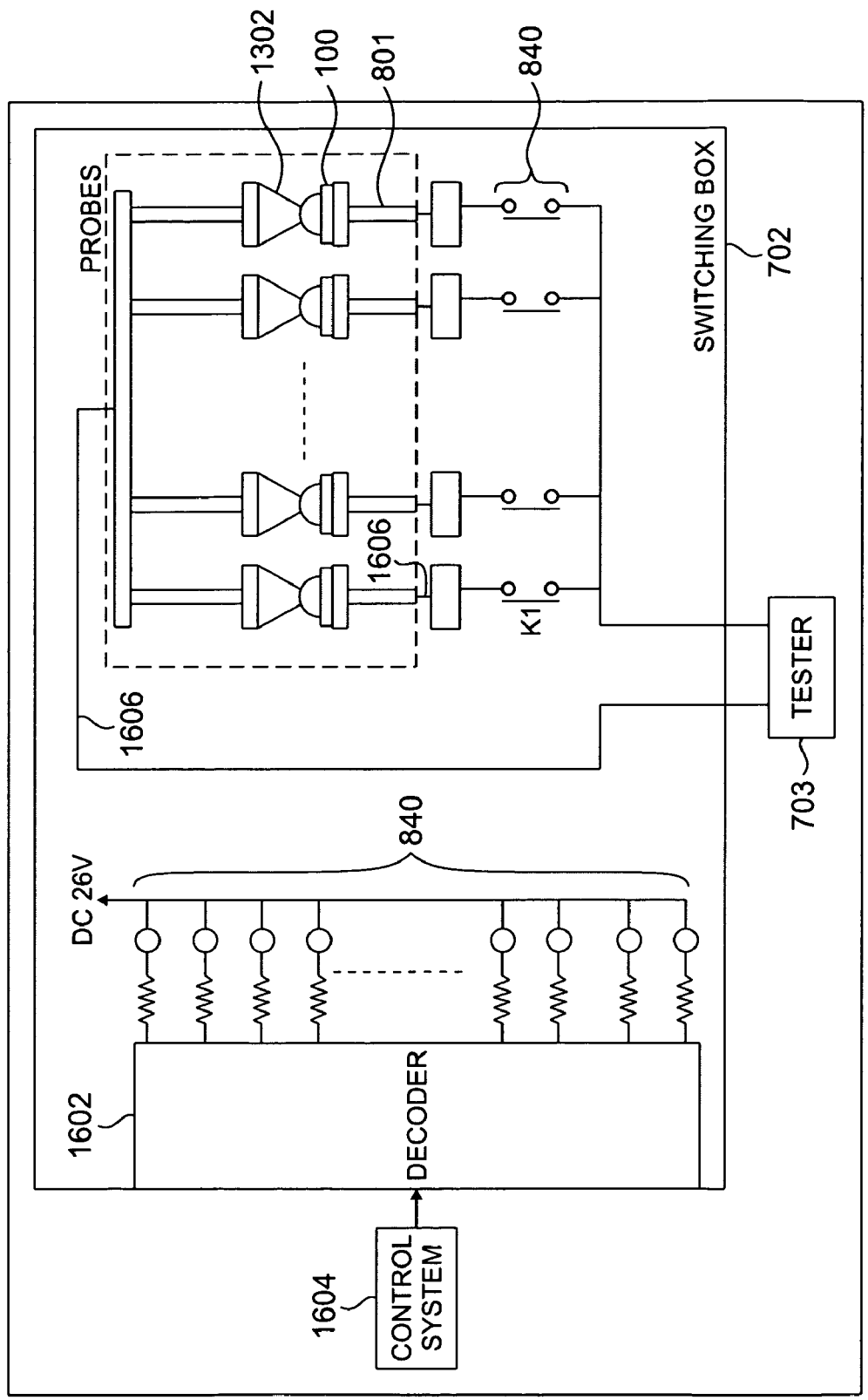
FIG. 16 is a high-level schematic diagram of certain circuitry of the switching box shown in FIG. 7, when the testing station is in normal operation as shown in FIG. 15.

FIG. 16 is a schematic diagram of the circuitry of one switching box as it operates when electronic elements 100 are disposed at testing station 410 as shown in FIG. 15. A decoder 1602 is responsive to a control system 1604 (discussed further below, in connection with FIG. 18), to separately operate switching circuits 840, such as reed relays, and to trigger tester 703 to sequentially test selected electronic elements 100. Conductive paths 1606 between each upper pole 1302 and each lower pole 801 of a probe connect the probe to a switching circuit 840 and/or tester 703.

Figure 17:
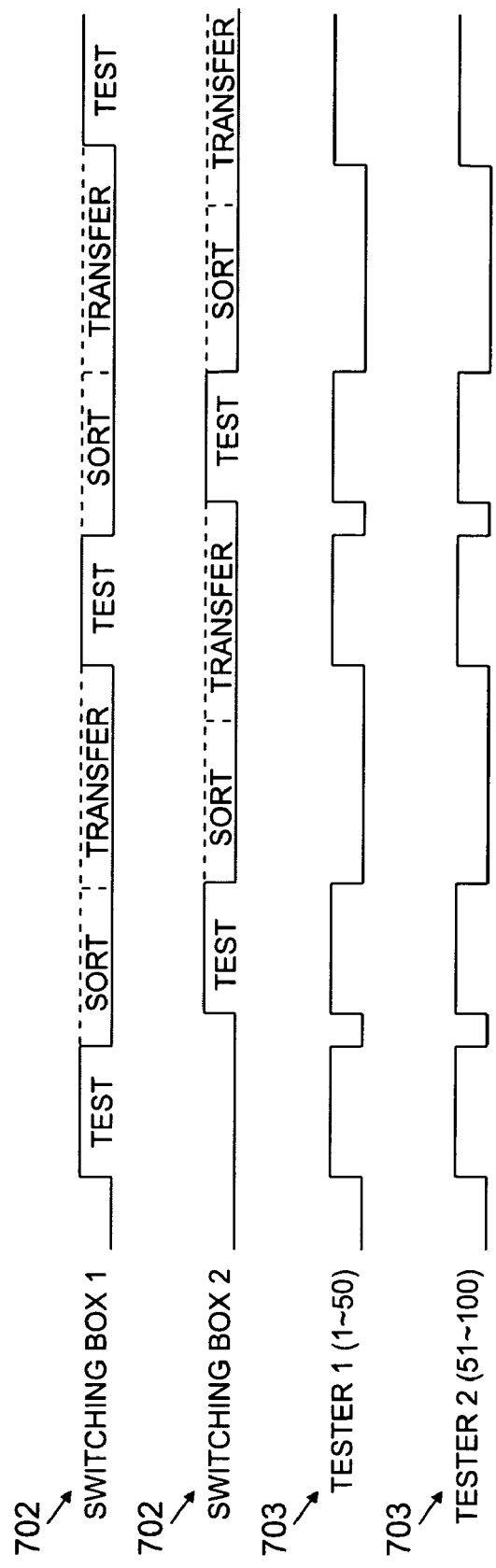
FIG. 17 is a timing chart illustrating a sequence of certain operations performed by the system shown in FIG. 4.

FIG. 17 is a timing chart illustrating the sequence of certain operations performed using system 400 (shown in FIG. 4), after electronic elements have been placed at testing station 410 as shown in FIG. 15. It can be seen that by using two switching boxes 702 and two testers 703, a first set of one hundred electronic elements may be tested at testing station 410, then a second set of one hundred electronic elements may be tested at testing station 410 while the first set of one hundred electronic elements is being transferred and/or sorted at sorting station 412.

Figure 18:
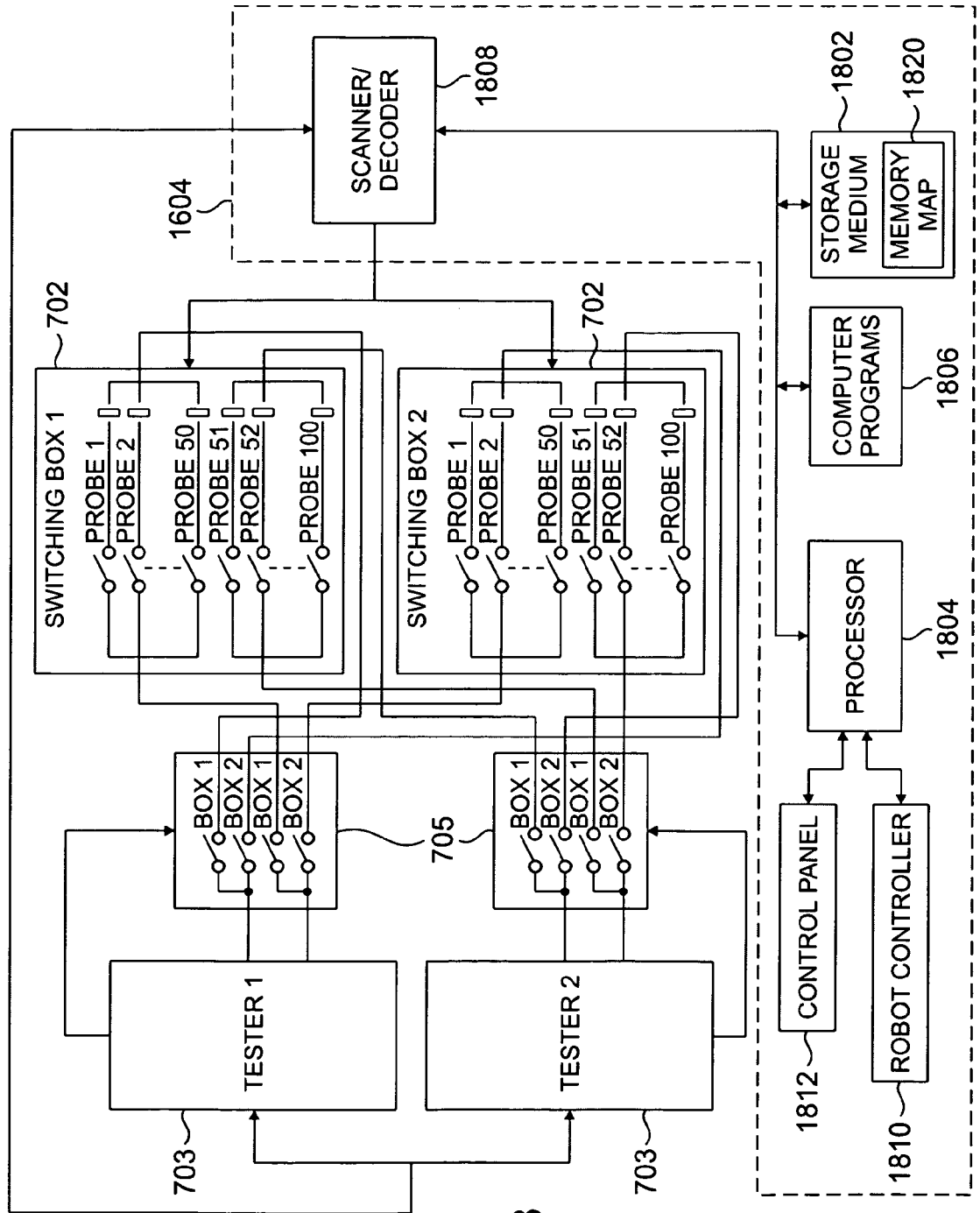
FIG. 18 is a simplified block diagram of the control system shown in FIG. 16, and a high-level schematic diagram illustrating control of certain circuitry at the testing station, when the testing station is in normal operation as shown in FIG. 15.

FIG. 18 is a simplified block diagram of control system 1604 (shown in FIG. 16), illustrating how switching boxes 702 and testers 703 are controlled when electronic elements are disposed at testing station 410 as shown in FIG. 15. Control system 1604 has an arrangement including items such as a computer-readable storage medium 1802, a processor 1804, computer programs 1806, a scanner/decoder 1808, a robot controller 1810, and a control panel 1812. Control system 1604 may also include other elements (not shown), such as: physical memory; additional storage devices; disk controllers; and human or device adapters or interfaces.

Processor 1804 is responsive to computer-readable storage medium 1802 and to computer programs 1806. Computer programs 1806 are generally organized into functional components that pertain to the testing and sorting of electronic elements by system 400 (shown in FIG. 4). Computer programs 1806 may be software stored in a computer-readable memory, such as computer-readable storage medium 1802, but also may be hardware or firmware, or any combination thereof.

Figure 19:
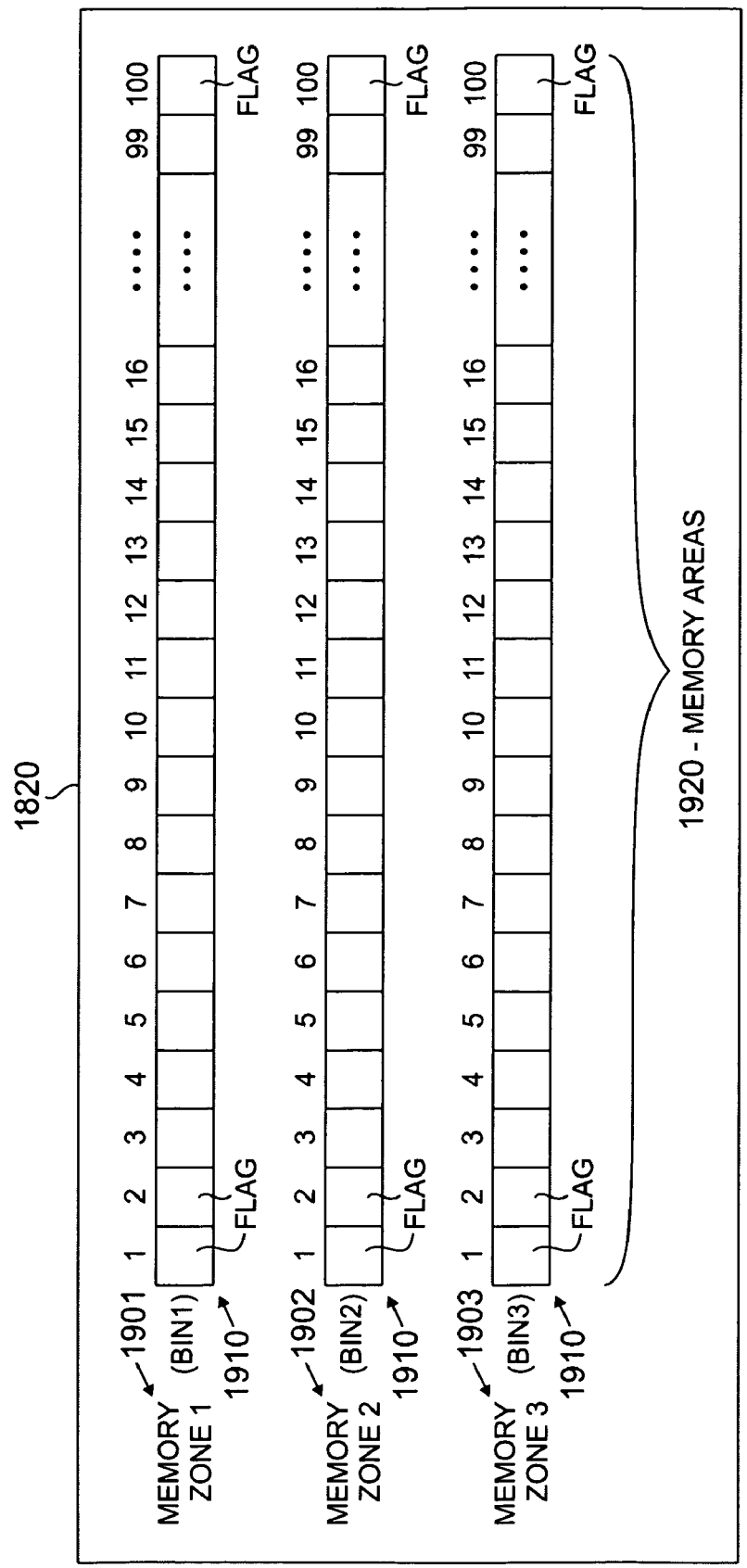
FIG. 19 is a diagram of the memory map shown in FIG. 18.

Computer-readable storage medium 1802 stores, among other things, a memory map 1820, which, as shown in FIG. 19, includes memory zone 1 1901, memory zone 2 1902, and memory zone 3 1903. The number of memory zones preferably corresponds to the number of sorting receptacles at sorting station 412 (shown in FIG. 4)—three bins 1402, 1404, and 1406 (shown in FIG. 14). A range of test result values from tester 703 (first shown in FIG. 7) may be associated with a particular memory zone/bin (for example, bins may be established for two types of diodes having passing test result values, and a bin may be established for diodes having failing test result values). The size of each memory zone is preferably a number of memory areas 1920, such as bits, corresponding to the number of probes associated with a switching box. In the case of switching boxes 702 shown in FIG. 18, which have one hundred probes associated therewith, each memory zone has one hundred memory areas 1920. When one set of one hundred electronic elements is tested, one tester will test elements 1-50, and the other one will test elements 51-100 concurrently Each memory area stores a flag, such as a bit that may be set to a value of one, or cleared to a value of zero. A pointer 1910, operable to point to one memory area, is associated with each memory zone. Memory map may also be created and/or stored by scanner/decoder 1808. In operation, as the system starts to test one set of one hundred electronic elements (assume switching box 1 702), switching selection circuit 705 (shown in FIG. 15) will select Box 1 (all box 1 switches turn to ON), then the switches of probe 1 and probe 51 on switching box 1 702 force to ON. Meanwhile, in each memory zone, pointers 1910 point to corresponding memory areas. (point to bit 1 (for tester 1) and bit 51 (for tester 2) of zone 1 1901, zone 2 1902, and zone 3 1903). The number of memory zones preferably corresponds to the number of sorting receptacles at sorting station 412, (shown in FIG. 4) three bins 1402, 1404, and 1406 (shown in FIG. 14) in this case. (For example, bins may be established for two types of diodes having passing test result values, and a bin may be established for diodes having failing test result values). Then trigger tester 1 and tester 2 703 to test the electronic elements on probe 1 and probe 51 simultaneously. Based on the setting of tester, the electronic element will be sorted to be one of three bins. The pointed address of each memory zone stores a flag, such as a bit that may be set to a value of one, or cleared to a value of zero. For example, testers are now testing the $1^{st}$ and the $51^{st}$ electronic elements on switching box 410 and the pointers 1910 are pointing to the $1^{st}$ and $51^{st}$ bit of each zones of memory map 1820 (as shown in FIG. 19), the electronic element 1 is sorted to be bin 2, and the electronic element 51 is sorted to be Failed—bin 3, the $1^{st}$ bit of zone 2 1902 and the $51^{st}$ bit of zone 3 1903 will be stored to one, the $1^{st}$ bits of zone 1 and zone 3 and the $51^{st}$ bits of zone 1 and zone 2 are cleared to zero. FIGS. 20 and 21 are diagrams of a front view and a side view, respectively, of a second system 2000 that uses various aspects of the present invention to handle a large number of electronic elements 100 (shown in FIG. 1), preferably diodes in chip form, in connection with measuring electrical characteristics of the elements and sorting the elements based on the measured electrical characteristics. System 2000 includes a feeder 2002, a shake loading station 2004, a transfer plate 2006, transfer arms 2008, a testing station 2010, and a sorting station 2012.

Feeder 2002 is constructed in a well-known manner of a combination of commercial and machined parts (not shown in detail), such as a hopper, a linear feeder, and a stand.

Shake loading station 2004 is constructed as discussed in connection with FIG. 6, and includes a shake loader and a shake unit. Also as discussed in connection with FIG. 6, shake loading station 2004 operates to align electronic elements in an array, which may be any desired size, but which is preferably arranged to receive at least one hundred twenty electronic elements.

Sorting station 2012 includes a hopper under which multiple receptacles (not visible), such as bins, may be located.

Figure 22:
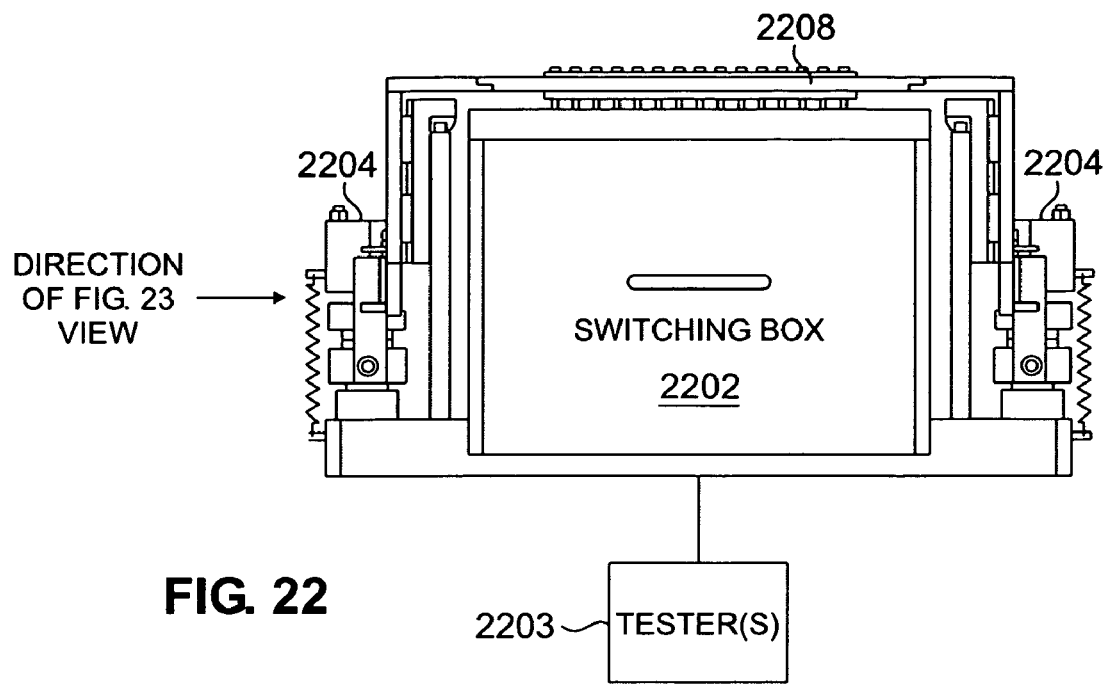
FIG. 22 is a diagram of a first external side view of a switching box located at the testing station shown in FIG. 20.
Figure 23:
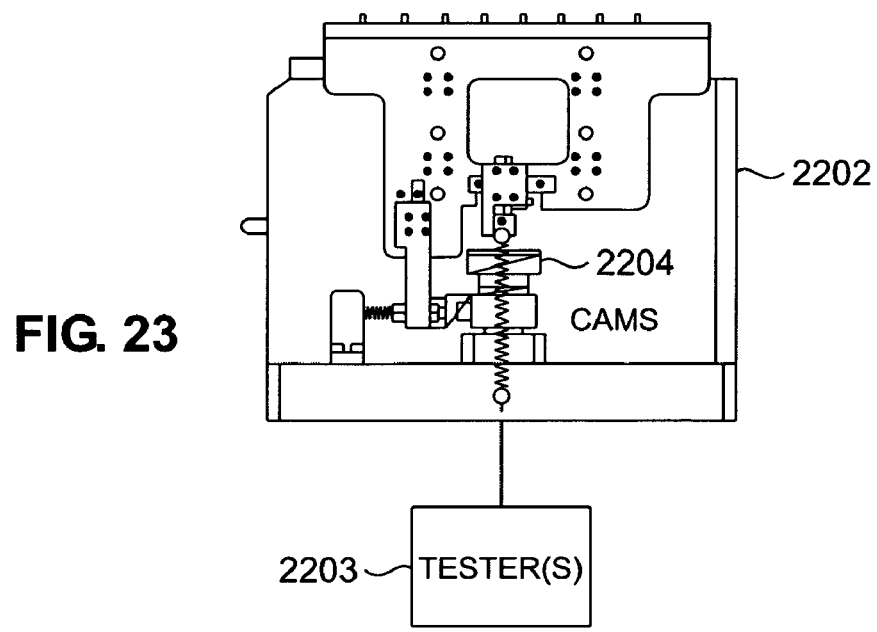
FIG. 23 is a second external side view of the switching box shown in FIG. 22.

Testing station 2010, shown in greater detail in FIGS. 22 and 23, includes, among other things, a switching box 2202 and one or more testers 2203 (two testers may be used, for example—one to test electronic elements 1 through 60, the second to test electronic elements 61 through 120). Switching box 2202 is responsive to tester 2203, which preferably includes one or more testing circuits 200 (shown in FIG. 2) and/or testing circuits 300 (shown in FIG. 3), suitable for testing diode reverse current (IR), and diode forward voltage (VF), respectively.

Internally, switching box 2202 includes elements (not shown, referring to FIGS. 7, 8 and 98) similar to those of switching box 702, including, among other things, a plate 704 having two sides—a top side 706 and a bottom side 708—and one or more switching boards 820. A motherboard 906 (first shown in FIG. 9) is a printed circuit board attached to bottom side 708, and lower poles 801 of probes may be disposed through, and soldered on, motherboard 906. The pins of edge connectors 902 may also be disposed through, and soldered on, the bottom side of motherboard 906. An array of lower pole regions 710, which may be holes or notches in plate 704, is located about top side 706. As can be seen in FIGS. 8 and 9, each lower pole region is configured to receive a lower pole 801 of a probe, or a portion thereof. Signal conductor regions 803, preferably made of a conductive metal such as copper, are disposed proximate the array of lower pole regions 710. Each signal conductor region 803 provides at least part of a non-cable electrical path between a lower pole region 710 and one or more switching circuits 840 on switching board 820, to enable lower poles 801 (when they are disposed in selected lower pole regions 710) to be in electrical communication with switching circuits 840 on switching board(s) 820 without the use of a large volume of cable-type wires that typically characterizes connections between probes and switching boards. As shown by arrow 910 in FIG. 9, when probes and edge connectors are soldered onto motherboard 906, testing signals will go through switching boards 820, edge connectors/pins 902, signal conductor regions 803 (such as metal-coated through-holes), and lower poles 801 to electronic elements 100. Thus, switching box 2202 provides a portable platform for testing a large number (at least one hundred twenty) of electronic elements 100, which may be more readily re-configured and more easily serviced than traditional testing station hardware.

Referring again to FIGS. 22 and 23, externally, switching box 2202 is flanked by cam assemblies 2204, which operate to position, in the horizontal and vertical directions, an array of upper poles 2208 proximate the complementary array of lower poles 801 (first shown in FIG. 8; when they are disposed in selected lower pole regions 710) on plate 704 (first shown in FIG. 7). The array of upper poles 2208 is preferably located on a bar(s) substantially parallel to plate 704. Two wires (not shown) are connected directly from upper poles 2208 to motherboard 906.

Referring again to FIGS. 20 and 21, two transfer plates 2006 utilize rubber suction tips arranged thereon in an array pattern to pick-up and place electronic elements. One of them is used to pick up electronic elements from shake loading station 2004 and to place those electronic elements at testing station 2010 for testing, and the other one is used to pick up tested electronic elements from testing station 2010, move them to sorting station 2012, and then sort electronic elements to sorting boxes.

During normal operation of system 2000, electronic elements 100 (shown in FIG. 1) arrive at shake loading station 2004. Transfer arms 2008 position transfer plate 2006 above an area substantially parallel to transfer plate 2006, such as above shake loading station 2002, testing station 2010, or sorting station 2012. The rubber suction tips on transfer plate 2006 may be moved vertically by one or more air cylinders (not shown), and horizontally by one or more actuators (not shown) in well-known manners to pick up electronic elements 100 from one position and to place electronic elements 100 in another position.

For example, when transfer plate 2006 is caused to pick up electronic elements from shake loading station 2004, and to place electronic elements at testing station 2010 such that lower poles 801 are in contact with selected terminal regions of the electronic elements, cam assemblies 2204 may be operated to position the complementary array of upper poles 2208 so that the upper poles contact selected terminal regions of the electronic elements. Cam assemblies 2204 allow the re-positioning of array 2208 onto different terminal regions of the same electronic element, so that each electronic element may be tested using one or more testing circuits.

Figure 24:
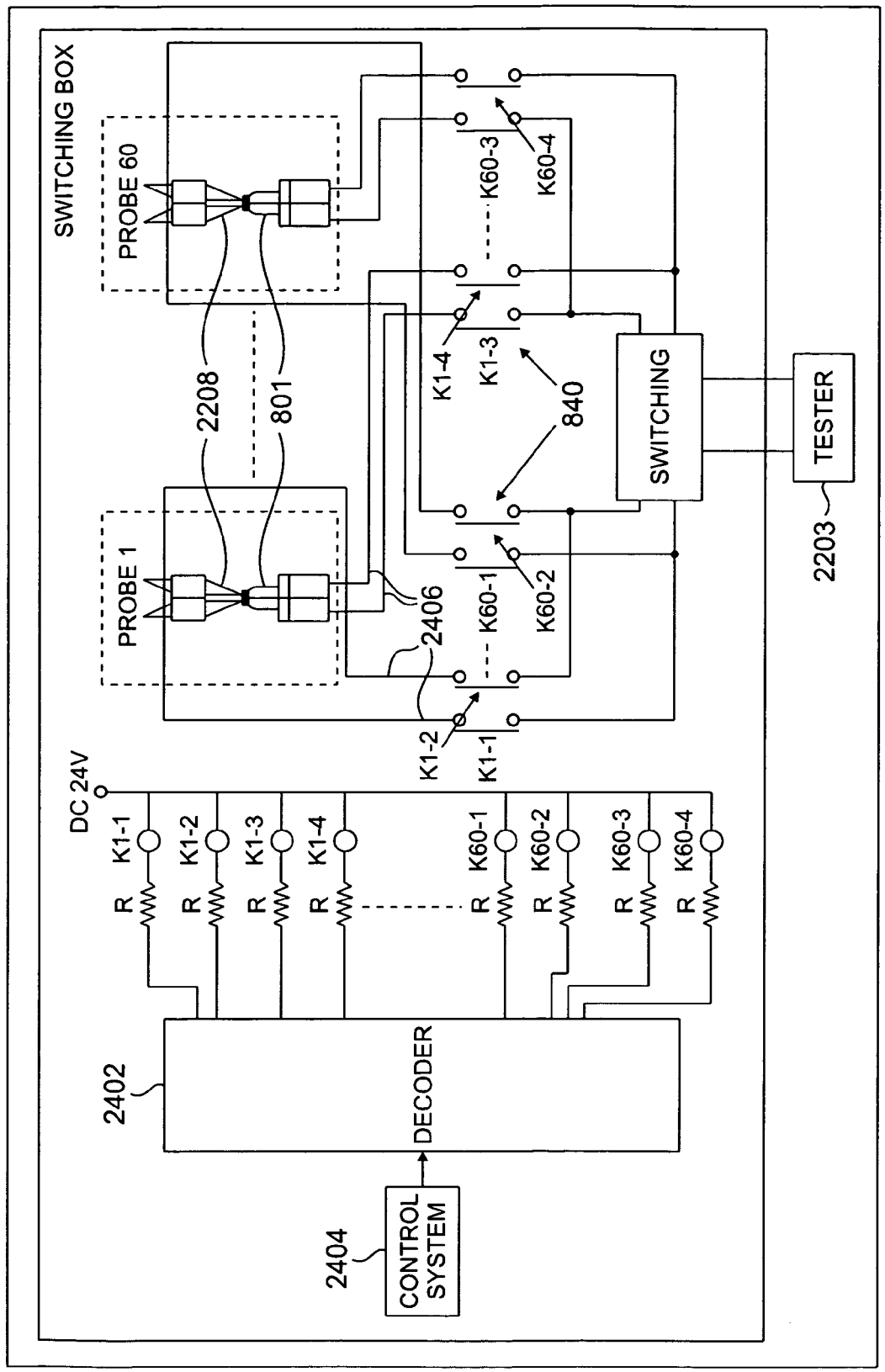
FIG. 24 is a high-level schematic diagram of certain circuitry of the switching box shown in FIG. 22, when the testing station shown in FIG. 20 is in normal operation.

FIG. 24 is a schematic diagram of the circuitry of switching box 2202 as it operates when electronic elements are disposed at testing station 2010 (shown in FIG. 20). A decoder 2402 is responsive to a control system 2404 (discussed further below, in connection with FIG. 26), to separately operate switching circuits 840, such as reed relays, and to trigger tester 2203 to sequentially test selected electronic elements. Conductive paths 2406 between each upper pole 2208 and each lower pole 801 of a probe connect the probe through switching circuits 840 and/or to tester 2203. Two testers (shown in FIG. 26) are used to concurrently test two electronic elements on probes (between each upper pole 2208 and each lower pole 801) switching box 2202 to halve testing time. One tester tests electronic elements on probes 1 through 60, the other tester tests electronic elements on probes 61 through 120.

Figure 25:
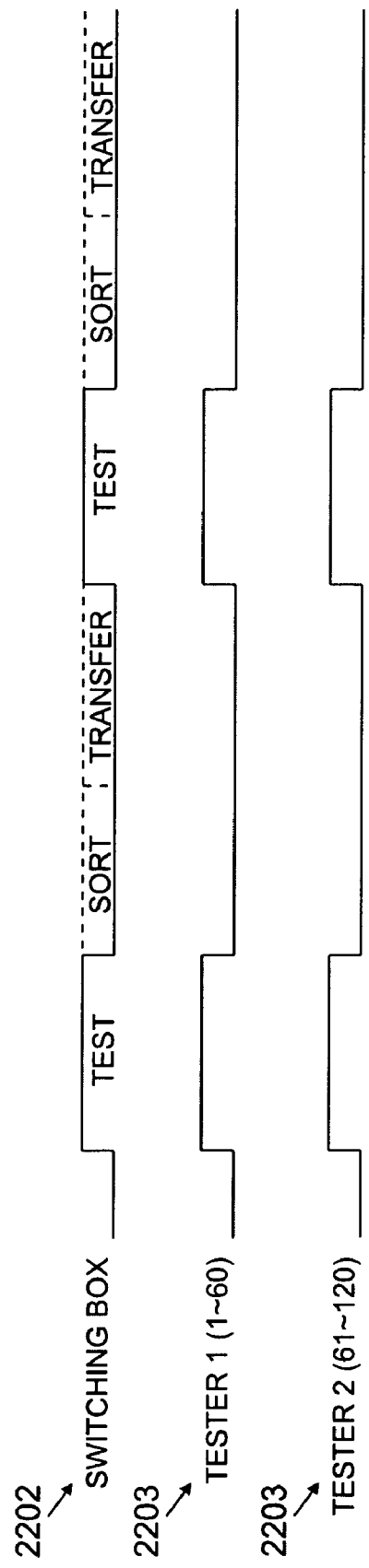
FIG. 25 is a timing chart illustrating a sequence of certain operations performed by the system shown in FIG. 20.

FIG. 25 is a timing chart illustrating the sequence of certain operations performed using system 2000 (shown in FIG. 20), after electronic elements have been placed at testing station 2010. It can be seen that by using switching box 2202 and two testers 2203, one hundred twenty electronic elements may be tested at testing station 2010, then transferred and/or sorted at sorting station 2012.

Figure 26:
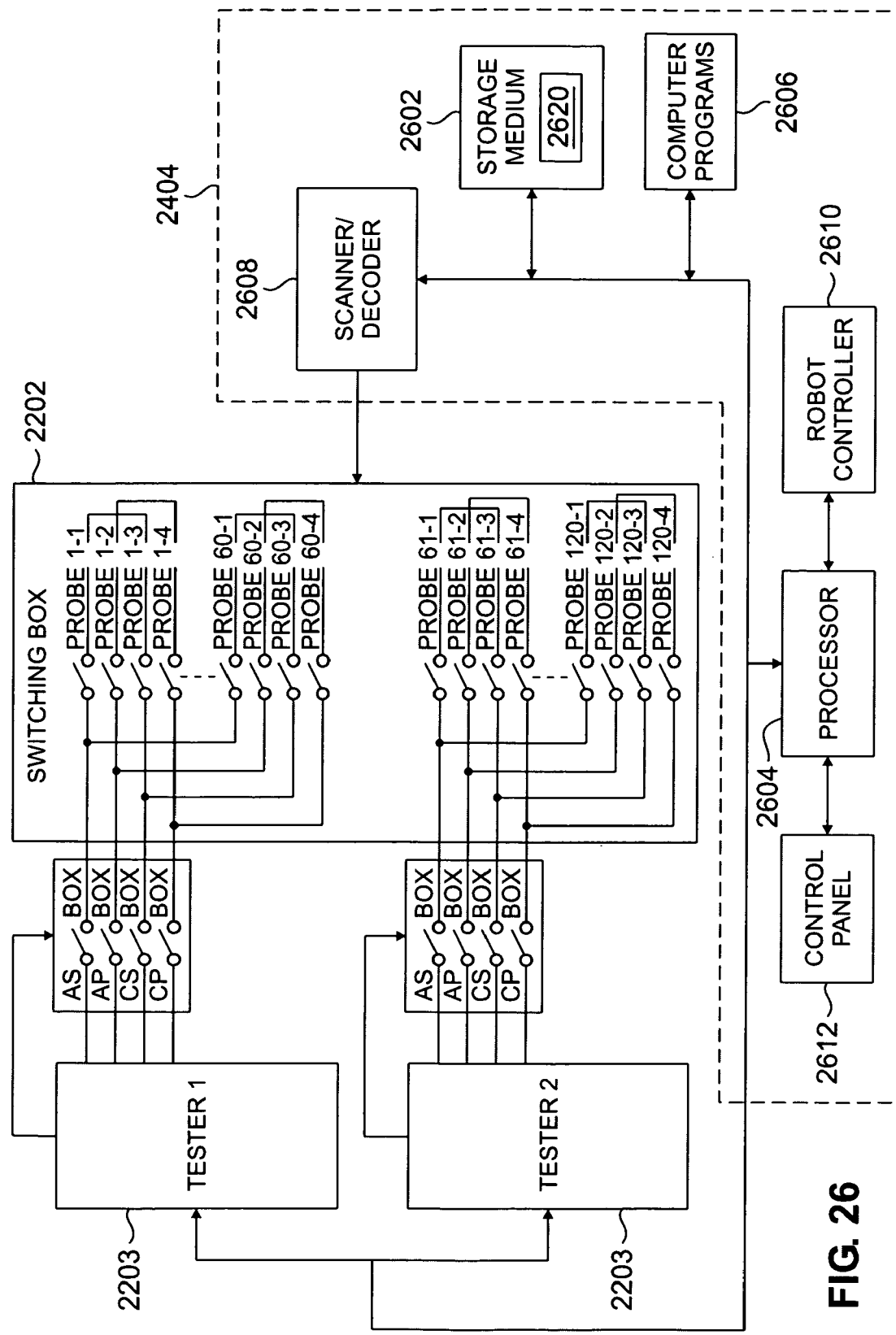
FIG. 26 is a simplified block diagram of the control system shown in FIG. 24, and a high-level schematic diagram illustrating control of certain circuitry at the testing station shown in FIG. 20, when the testing station is in normal operation.

FIG. 26 is a simplified block diagram of control system 2404 (shown in FIG. 24), illustrating how switching box 2202 and testers 2203 are controlled when electronic elements are disposed at testing station 2010. Control system 2404 has an arrangement including items such as a computer-readable storage medium 2602, a processor 2604, computer programs 2606, a scanner/decoder 2608, a robot controller 2610, and a control panel 2612. Control system 2404 may also include other elements (not shown), such as: physical memory; additional storage devices; disk controllers; and human or device adapters or interfaces.

Processor 2604 is responsive to computer-readable storage medium 2602 and computer programs 2606. Computer programs 2606 are generally organized into functional components that pertain to the testing and sorting of electronic elements by system 2000. Computer programs 2606 may be software stored in a computer-readable memory, such as computer-readable storage medium 2602, but also may be hardware or firmware, or any combination thereof.

Figure 27:
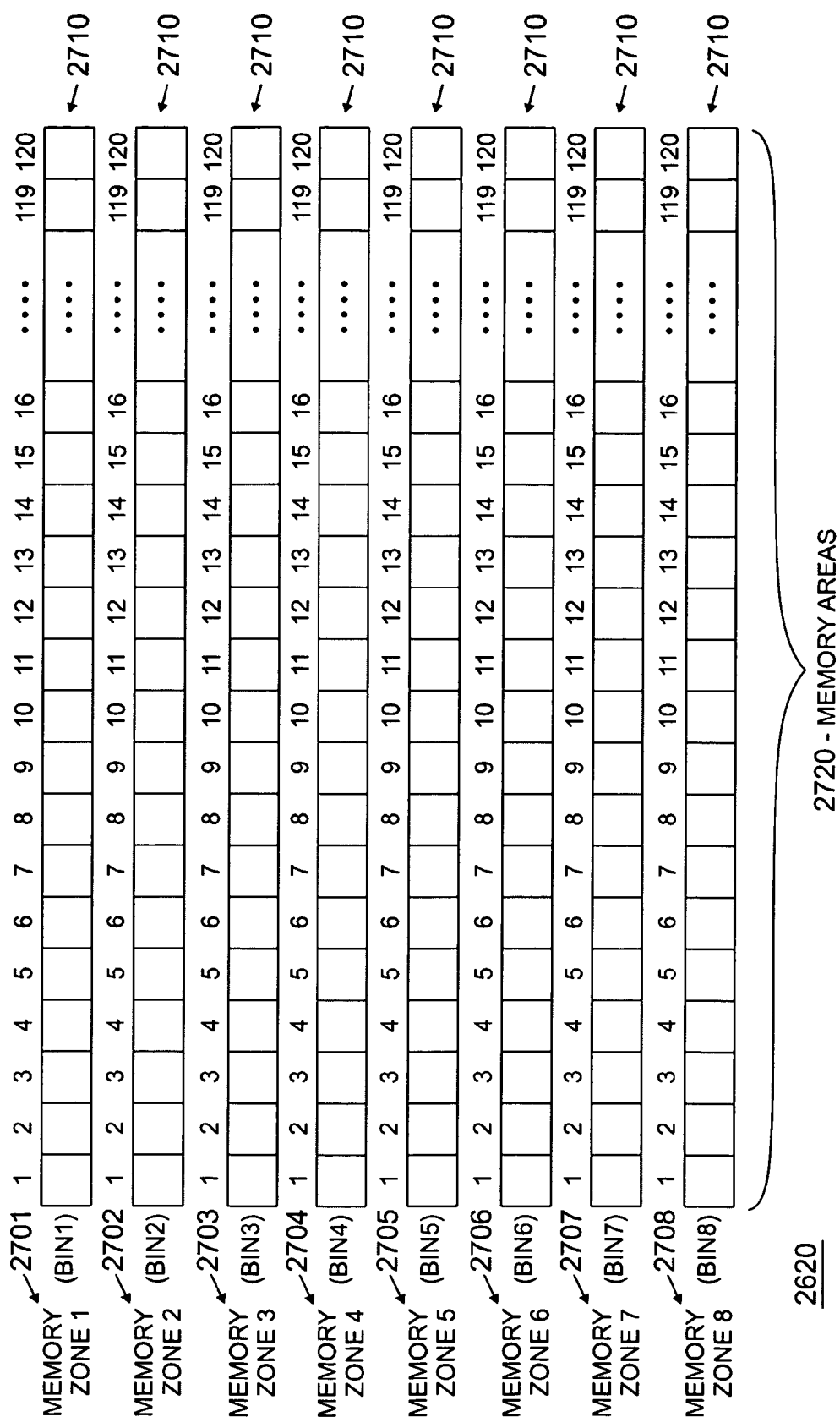
FIG. 27 is a diagram of the memory map shown in FIG. 26.

Computer-readable storage medium 2602 stores, among other things, a memory map 2620, which, as shown in FIG. 27, includes memory zone 1 2701, memory zone 2 2702, memory zone 3 2703, memory zone 4 2704, memory zone 5 2705, memory zone 6 2706, memory zone 7 2707, and memory zone 8 2708. The number of memory zones corresponds to the number of sorting receptacles (not shown, preferably eight) at sorting station 2012 (shown in FIG. 20). A range of test result values from tester 2203 (first shown in FIG. 22) may be associated with a particular memory zone/bin (for example, bins may be established for various types of diodes having passing test result values, and a bin may be established for diodes having failing test result values). The size of each memory zone is preferably a number of memory areas 2720, such as bits, corresponding to the number of probes associated with a switching box. In the case of switching box 2202 shown in FIG. 26, which has one hundred twenty probes associated therewith, each memory zone has one hundred twenty memory areas 2720. Each memory area stores a flag, such as a bit that may be set to a value of one, or cleared to a value of zero. A pointer 2710 (there are two pointers 2710, operable to point to two memory areas/addresses at the same time), which is operable to point to one memory area, is associated with each memory zone. Memory map may also be created and/or stored by scanner/decoder 2608.

Figure 28:
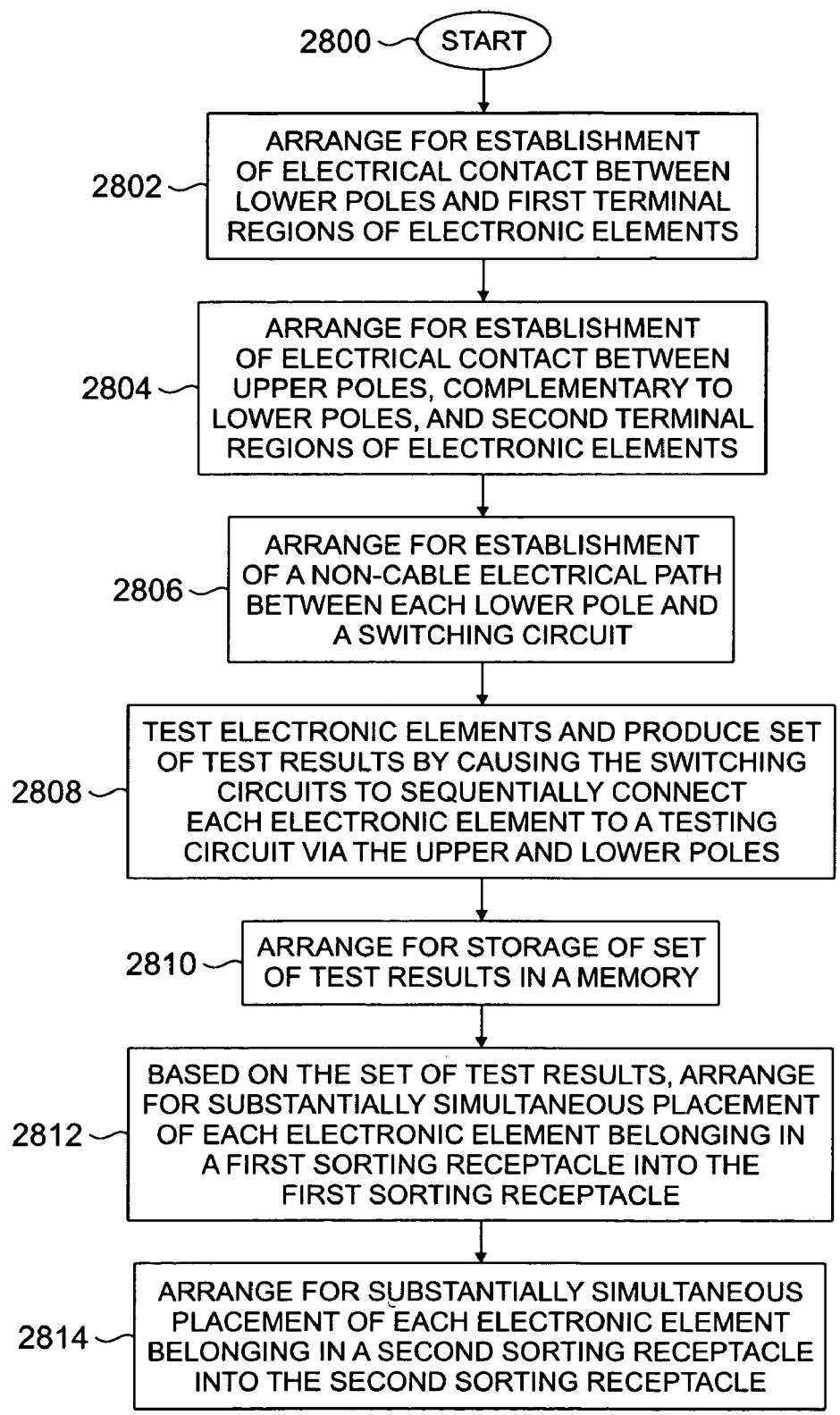
FIG. 28 is a flowchart of a method for sorting a number of electronic elements, such as those depicted in FIG. 1, using the systems shown in FIGS. 4 and/or 20, in accordance with certain aspects of the present invention.

With continuing reference to FIGS. 1-27, in accordance with certain aspects of the present invention, FIG. 28 is a flowchart of a method for sorting a number of electronic elements, such electronic elements 100 (shown in FIG. 1), using a system such as system 400 (shown in FIG. 4) and/or system 2000 (shown in FIG. 20). Electronic elements are sorted into a plurality of sorting receptacles, such as sorting bins 1402, 1404, and 1406, or sorting bins (not shown) associated with sorting station 2012 (shown in FIG. 20). A number of probes and a testing apparatus are used in the sorting process. Each probe has a lower pole, such as lower pole 801 (shown first in FIG. 8), and an upper pole, such as upper pole 1302 (shown first in FIG. 13) or upper poles 2208 (shown in FIG. 22).

The testing apparatus includes a plate, such as plate 704 (shown first in FIG. 7), having two sides. One side, which may be a printed circuit board such as motherboard 906, has an array of lower pole regions, such as regions 710 (also shown first in FIG. 7) disposed thereabout, and each lower pole region is configured to receive a lower pole of a probe. The testing apparatus also includes a number of signal conductor regions, such as signal conductor regions 803 (shown in FIG. 8) disposed proximate the array of lower pole regions. Each signal conductor region is arranged to provide a non-cable electrical path between a lower pole region and a switching circuit, such as reed relays 840 on switching board 820.

The method begins at oval 2800, and continues at block 2802, where, when lower poles are disposed in at least some of the lower pole regions, it is arranged for the establishment of electrical contact between each lower pole and a first terminal region of an electronic element, such as one terminal region 104 of electronic element 100 (shown in FIG. 1). At block 2804, it is arranged for the establishment of electrical contact between each of a number of upper poles, complementary to the lower poles, and second terminal regions of the electronic elements.

In connection with the operation of system 400 (shown in FIG. 4), suction tips 1302 (first shown in FIG. 13) on transfer plate 406 may be maneuvered by transfer arm 408 to pick up electronic elements from shake loading station 404 and to place the electronic elements at testing station 410 in such a manner that suction tips 1302, which function as upper poles, are in contact with selected terminal regions of the electronic elements, and complementary lower poles 801 are in contact with corresponding terminal regions of the electronic elements.

System 2000 (shown in FIG. 20) may be operated to cause the rubber suction tips on transfer plate 2006 to pick up electronic elements from shake loading station 2004 and to place the electronic elements at testing station 2010 in such a manner that lower poles 801 (first shown in FIG. 8) are in contact with selected terminal regions of the electronic elements. Cam assemblies 2204 (shown in FIGS. 22 and 23) may be operated to position array of upper poles 2208 (shown in FIG. 22) such that the upper poles are in contact with corresponding terminal regions of the electronic elements. For example, when transfer plate 2006 picks up electronic elements from shake loading station 2004, and places electronic elements at testing station 2010 such that lower poles 801 are in contact with selected terminal regions of the electronic elements, cam assemblies 2204 may be operated to position and/or re-position the complementary array of upper poles 2208 to contact other selected terminal regions of the electronic elements.

The step of arranging for the establishment of a non-cable electrical path between each lower pole and a switching circuit is shown at block 2806. Using motherboard 906 to integrate probes 801 and switching boards 820 may provide at least part of the non-cable electrical path between each lower pole region 710 (first shown in FIG. 7) and one or more switching circuits, such as switching boards 820 (first shown in FIG. 8) and/or reed relays 840 (shown in FIG. 8). Other portions of the non-cable electrical path may include edge connectors 902 (shown in FIG. 12) and/or other elements on plate 704 (first shown in FIG. 7) or switching boards 820 (first shown in FIG. 8).

At block 2808, the electronic elements are tested, and a set of test results is produced, by causing the switching circuits to sequentially connect each electronic element to a testing circuit via the upper and lower poles.

In system 400 (shown in FIG. 4), for example, as illustrated in FIG. 16, decoder 1602 is responsive to a control system 1604 to separately operate switching circuits 840 (shown in FIG. 8), and to trigger tester 703 (first shown in FIG. 7) to sequentially test selected electronic elements. Conductive paths 1606 between each upper pole 1302 (shown in FIG. 13) and each lower pole 801 (first shown in FIG. 8) of a probe connect the probe to a switching circuit 840 and/or tester 703.

Likewise, as illustrated in FIG. 24, in system 2000 (shown in FIG. 20), decoder 2402 is responsive to a control system 2404, to separately operate switching circuits 840 (shown in FIG. 8), and to trigger tester 2203 (first shown in FIG. 22) to sequentially test selected electronic elements. Conductive paths 2406 between each upper pole 2208 (shown in FIG. 22) and each lower pole 801 (first shown in FIG. 8) of a probe connect the probe to a switching circuit 840 and/or tester 2203. A reed relay 840 associated with an electronic element and a probe is connected to a testing circuit, and a test result is produced.

It is arranged for the set of test results to be stored in a memory, at block 2810. Memory maps 1820 and 2620 (shown in FIGS. 18 and 26, respectively), located in computer-readable storage media 1802 and 2602, respectively (also shown in FIGS. 18 and 26, respectively), may comprise and/or store the set of test results.

Referring to FIGS. 19 and 27, at the time of testing a particular electronic element using a particular probe, in each memory zone, pointers 1910 and 2710 point to corresponding memory areas—with respect to FIG. 19, for example, pointer 1910 associated with memory zone 1 1901 points to the first memory area 1920 within memory zone 1 1901, pointer 1910 associated with memory zone 2 1902 points to the first memory area 1920 within memory zone 2 1902, and pointer 1910 associated with memory zone 3 1903 points to the first memory area 1920 within memory zone 3 1903. After the electronic element has been tested by the testing circuit using a particular probe, the test result may be stored by setting a flag (for example, by setting a bit to a value of one) in the memory area of the memory zone corresponding to the bin in which the electronic element belongs. The flags in the memory areas of the memory zones corresponding to other bins may be cleared (for example, by setting a bit to a value of zero). A range of test result values may be associated with a particular memory zone. Referring again to FIG. 19, if, for example, a test result value indicates that a tested electronic element belongs in bin 1, then a value of one may be stored in the first memory area 1920 within memory zone 1 1901, and zeroes may be stored in the first memory areas 1920 within memory zones 2 1902 and 3 1903. When the process is repeated to sequentially test all electronic elements, flags within all memory areas of each memory zone will have been set or cleared with the aid of pointers 1910.

Next, at block 2812, based on the set of test results, each electronic element belonging in a first sorting receptacle is arranged to be placed substantially simultaneously into the first sorting receptacle, and at block 2814, after the step at block 2812 has been completed, each electronic element belonging in a second sorting receptacle is arranged to be placed substantially simultaneously into the second sorting receptacle.

In operation of system 400 (shown in FIG. 4), for example, suction tips 1302 (shown in FIG. 13) on transfer plate 406 may be moved vertically by one or more air cylinders (not shown), and horizontally by one or more actuators (not shown) to pick up electronic elements from testing station 410 and to place electronic elements over sorting station 412. Similarly, with respect to system 2000 (shown in FIG. 20), the rubber suction tips on transfer plate 2006 may be moved vertically by one or more air cylinders (not shown), and horizontally by one or more actuators (not shown) to pick up electronic elements from testing station 2010 and to place the electronic elements over bins (not shown) at sorting station 2012.

Memory zones 1 1901 (shown in FIG. 19) and 2701 (shown in FIG. 27), corresponding to the first sorting bins of systems 400 and 2000, respectively (shown in FIGS. 4 and 20, respectively), may be consulted to determine which electronic elements to release into the first sorting bins. For example, electronic elements in positions of suction tips corresponding to memory areas 1920 and 2720 within memory zones 1 1901 and 2701, respectively, having flags set to values of one may be released to the first sorting bins. Likewise, flags set in memory areas 1920 and 2720 of memory zones 2 1902 and 2702, respectively, identify electronic elements that should be released to the second sorting bins, and so on.

The foregoing methods may be implemented by software, firmware, hardware, or a combination thereof. For example, one or more computer programs, such as computer programs 1806 (shown in FIG. 18) or 2606 (shown in FIG. 26), which may be encoded on one or more computer-readable media, such as storage media 1802 or 2602, respectively, and which, when loaded into a processor, such as processors 1804 or 2604, respectively, may implement the methods. Such computer programs may be implemented according to well-known software engineering practices. It will be understood, however, that aspects of the present invention are not limited to any specific embodiments of computer software or signal processing methods. For example, one or more processors packaged together or separately may implement the functions described herein in a variety of ways. It will also be appreciated that computer programs 1806 and 2606 may be any stored instructions, in one or more parts, that electronically control functions described herein.

Although specific functional elements and arrangements thereof have been described herein, it is contemplated that the systems, apparatuses and methods herein may be implemented in a variety of ways. Functional elements may be packaged together or individually, or may be implemented by fewer, more or different devices. When one element is indicated as being responsive to another element, the elements may be directly or indirectly coupled. Connections depicted herein may be logical or physical in practice to achieve a coupling or communicative interface between elements. Connections may be implemented as inter-process communications among software processes.

It will furthermore be apparent that other and further forms of the invention, and embodiments other than the specific embodiments described above, may be devised without departing from the spirit and scope of the appended claims and their equivalents, and it is therefore intended that the scope of this invention will only be governed by the following claims and their equivalents.

We claim:

1. A method for sorting a number of electronic elements into a plurality of sorting receptacles using a testing apparatus and a number of probes, each probe having a lower pole and an upper pole, the method comprising:

when lower poles are disposed at at least some lower pole regions, the lower pole regions being part of an array of lower pole regions disposed about a first side of a plate having a first side and a second side and each lower pole region configured to receive a lower pole of a probe, arranging for establishment of electrical contact between each lower pole and a first terminal region of an electronic element;

arranging for establishment of electrical contact between each of a plurality of upper poles and a second terminal region of the electronic element, each upper pole complementary to a lower pole;

arranging for establishment of a non-cable electrical path between each lower pole and a switching circuit, wherein a plurality of signal conductor regions are disposed proximate the array of lower pole regions, each signal conductor region arranged to provide a non-cable electrical path between a lower pole region and at least one of a plurality of switching circuits;

testing the electronic elements by sequentially connecting each electronic element to a testing circuit via the upper and lower poles, the testing circuit producing a set of test results;

arranging for storage of the set of test results in a memory; and based on the set of test results, arranging for substantially simultaneous placement of each electronic element belonging in a first sorting receptacle into the first sorting receptacle; and after the step of placing each electronic element belonging in the first sorting receptacle into the first sorting receptacle, based on the set of test results, arranging for substantially simultaneous placement of each electronic element belonging in a second sorting receptacle into the second sorting receptacle, wherein the step of arranging for storage of the set of test results in a memory further comprises:

locating a number of memory zones in the memory, each memory zone corresponding to a predetermined range of test results and having a number of test result areas corresponding to the number of electronic elements, the memory zones and the test result areas collectively comprising a memory map; and arranging for storage of a particular test result of the set of test results in the memory map, wherein the step of arranging for storage of a particular test result of the set of test results in the memory map comprises:

after testing a particular electronic element, arranging for storage of the test result in a particular test result area of each memory zone, and wherein step of arranging for storage of the test result in a particular test result area of each memory zone comprises one of setting and clearing a flag in the particular test result area of each memory zone.

2. The method according to claim 1, wherein when a flag is set in a particular test result area of one memory zone, a flag is cleared in a corresponding test result area of another memory zone.

3. The method according to claim 1, wherein the number of sorting receptacles corresponds to the number of memory zones.

4. The method according to claim 3, wherein the step of arranging for substantially simultaneous placement of each electronic element belonging in a first sorting receptacle into the first sorting receptacle further comprises:

identifying a particular memory zone corresponding to the first sorting receptacle;

for each test result area of the identified memory zone, determining whether the flag in each test result area indicates an electronic element associated with the test result area belongs in the first sorting receptacle; and arranging for substantially simultaneous placement of each electronic element in the first sorting receptacle when the flags in the test result areas associated with the electronic elements indicate that the electronic elements belong in the first sorting receptacle.

5. A computer-readable medium encoded with a computer program which, when loaded into a processor, implements the method of claim 1.

* * * * *